(12) United States Patent
Shibazaki

(10) Patent No.: US 7,764,447 B2
(45) Date of Patent: Jul. 27, 2010

(54) OPTICAL ELEMENT HOLDING DEVICE, LENS BARREL, EXPOSING DEVICE, AND DEVICE PRODUCING METHOD

(75) Inventor: Yuichi Shibazaki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/776,942

(22) Filed: Jul. 12, 2007

(65) Prior Publication Data

US 2007/0279768 A1 Dec. 6, 2007

Related U.S. Application Data

(63) Continuation of application No. 11/294,239, filed on Dec. 5, 2005, now abandoned, and a continuation of application No. PCT/JP2004/007947, filed on Jun. 7, 2004.

(30) Foreign Application Priority Data

Jun. 6, 2003 (JP) .............................. 2003-163023

(51) Int. Cl.
*G02B 7/02* (2006.01)
(52) U.S. Cl. .................. 359/822; 359/813; 359/824
(58) Field of Classification Search .................. 359/822
See application file for complete search history.

(56) References Cited

U.S. PATENT DOCUMENTS

| 5,383,168 | A | 1/1995 | O'Brien et al. |
|---|---|---|---|
| 5,822,133 | A | 10/1998 | Mizuno et al. |
| 5,986,827 | A | 11/1999 | Hale |
| 6,191,898 | B1 | 2/2001 | Trunz et al. |
| 6,229,657 | B1 | 5/2001 | Holderer et al. |
| 6,239,924 | B1 | 5/2001 | Watson et al. |
| 6,257,957 | B1 * | 7/2001 | Murray et al. ............. 451/9 |
| 6,259,571 | B1 | 7/2001 | Holderer et al. |
| 6,271,976 | B1 | 8/2001 | Weber |
| 6,275,344 | B1 | 8/2001 | Holderer |
| 6,307,688 | B1 | 10/2001 | Merz et al. |
| 6,388,823 | B1 | 5/2002 | Gaber et al. |
| 6,400,516 | B1 | 6/2002 | Spinali |
| 6,674,584 | B2 | 1/2004 | Anderson |
| 6,734,949 | B2 | 5/2004 | Franken |

(Continued)

FOREIGN PATENT DOCUMENTS

EP 1137054 9/2001

(Continued)

OTHER PUBLICATIONS

European Office Action dated May 15, 2008 for related EP application 04 745 657.9-2217.

(Continued)

*Primary Examiner*—Jessica T Stultz
(74) *Attorney, Agent, or Firm*—Fox Rothschild, LLP

(57) ABSTRACT

A frame member of an optical element holding device integrally includes an inner ring, an outer ring, six arms, and a lever connected to each arm. Each arm is rotatably connected to the inner ring and the lever. The lever is rotatable with respect to the outer ring. The orientation of the inner ring and the orientation of the optical element are adjusted in according with the displacement of the lever caused by a displacement module.

29 Claims, 13 Drawing Sheets

U.S. PATENT DOCUMENTS

| | | | |
|---|---|---|---|
| 6,853,443 B2 | 2/2005 | Nishi | |
| 6,930,842 B2 | 8/2005 | Shibazaki | |
| 7,035,056 B2 | 4/2006 | Franken et al. | |
| 7,477,842 B2 * | 1/2009 | Gutierrez | 396/133 |
| 2002/0163741 A1 | 11/2002 | Shibazaki | |
| 2003/0117600 A1 | 6/2003 | Taniuchi et al. | |
| 2003/0189769 A1 * | 10/2003 | Anderson | 359/819 |
| 2003/0234916 A1 * | 12/2003 | Watson | 355/53 |
| 2004/0070852 A1 | 4/2004 | Omura et al. | |
| 2006/0158749 A1 * | 7/2006 | Sorg et al. | 359/819 |
| 2009/0103199 A1 * | 4/2009 | Soemers et al. | 359/872 |

FOREIGN PATENT DOCUMENTS

| | | |
|---|---|---|
| JP | 2002519843 | 2/2000 |
| JP | 2000206389 | 7/2000 |
| JP | 2000235134 | 2/2001 |
| JP | 2002107595 | 8/2001 |
| JP | 2002131605 | 8/2001 |
| JP | 2002131605 | 5/2002 |
| JP | 2002519843 | 7/2002 |
| JP | 2003-029116 | 1/2003 |
| JP | 200329116 | 1/2003 |
| WO | 9967683 | 12/1999 |

OTHER PUBLICATIONS

Summons to attend oral proceedings, mailed Nov. 12, 2008, for corresponding European Patent Application No. 04745657.9.

European Office Action dated May 8, 2008 for related EP application 04 745 657.9-2217, including pages on Form 2906.

Office Action dated Apr. 13, 2010 in Related Japanese Patent Application No. 2005-506808.

* cited by examiner

Fig. 12(A)
Fig. 12(B)
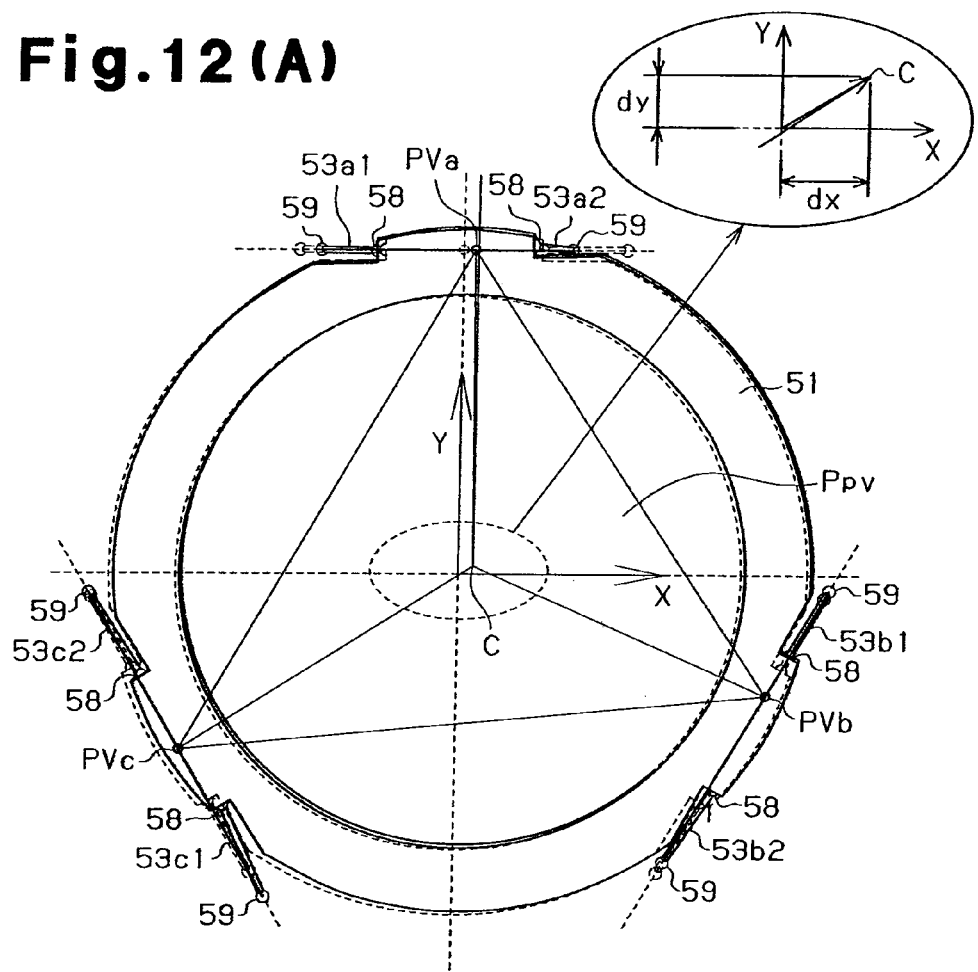
Fig. 13
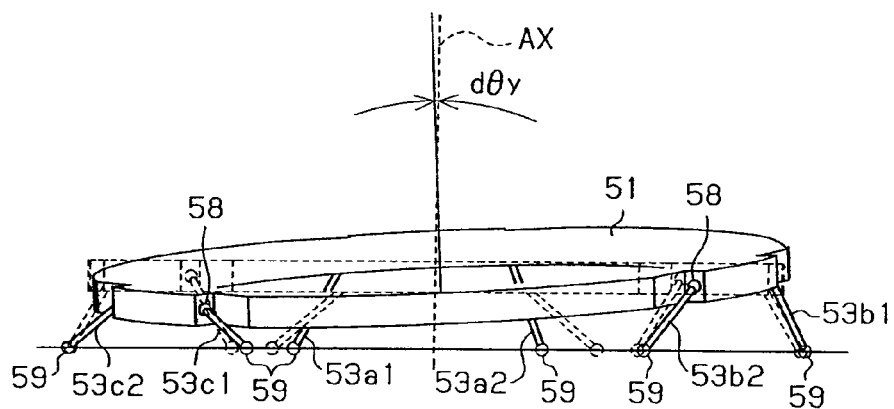

OPTICAL ELEMENT HOLDING DEVICE, LENS BARREL, EXPOSING DEVICE, AND DEVICE PRODUCING METHOD

CROSS-REFERENCE TO RELATED APPLICATIONS

This non-provisional application is a continuation application of and claims the benefit of International Application No. PCT/JP2004/007947, filed on Jun. 7, 2004, the entire contents of which are incorporated herein by reference.

BACKGROUND OF THE INVENTION

The present invention relates to an optical element holding device for holding an optical element, a barrel incorporating the holding device, an exposure apparatus, and a method for manufacturing a device.

FIG. 17 and FIG. 18 show an optical element holding device incorporated in an exposure apparatus, which is used during a lithography step of a manufacturing process for a semiconductor device, a liquid crystal display device, an imaging device, a thin-film magnetic head, a reticle, a photomask, and the like. The conventional optical element holding device includes an annular frame body 302 and three clamp members 306. Three seats (projections) 304 for supporting an optical element 301, such as a lens, are formed at equiangular intervals on the inner circumferential surface of the frame body 302. Three threaded holes 305 are formed in the upper surface of the frame body 302 at positions corresponding to the three seats 304. The clamp members 306 are attached to the threaded holes 305 with bolts 307.

The bolts 307 are fastened to hold the periphery 301a of the optical element 301 between the clamp members 306 and the seats 304.

Due to increasing integration of a semiconductor device, there is a demand for an exposure apparatus enabling exposure of finer patterns. More specifically, there is a demand for an exposure apparatus provided with a projection optical system having an extremely small wave aberration or distortion. To satisfy such a demand, the optical axis of the optical element 301 must be accurately positioned when installing the optical element 301 in the projection optical system.

Conventionally, the optical element 301 is positioned in the following manner. First, the optical element 301 is held on the frame body 302. The outer circumferential surface and the bottom surface of the frame body 302 are then respectively engaged with an inner wall and a receiving portion of a barrel to attach the frame body 302 to the barrel. This positions the optical axis of the optical element 301. The degree of freedom is extremely small and exists when attaching the frame body 302 to the barrel, and the task of attaching the frame body 302 to the barrel is a troublesome task that requires much care.

The optical element 301 is sandwiched between the clamp members 306 and the seats 304 and held by the frame body 302 in a state with subtle degree of freedom. When the frame body 302 is attached to the barrel in a slightly tilted state, the frame body 302 may be subjected to excessive load and may be distorted. When the frame body 302 is distorted, unpredictable stress caused by such distortion may act on the optical element 301 and lower the accuracy of the optical surface of the optical element 301.

A recent exposure apparatus for manufacturing semiconductors uses exposure light of shorter wavelengths to expose finer patterns with high accuracy. For instance, ultraviolet light of an i line ($\lambda$=365 nm), far ultraviolet light of a KrF excimer laser ($\lambda$=248 nm), ArF excimer laser ($\lambda$=193 nm), and F2 laser ($\lambda$=157 nm) of short wavelengths are used. In the exposure apparatus using exposure light having a short wavelength as described above, position adjustment of the optical element in the barrel is necessary to maximize the imaging capability with the shorter wavelength of the exposure light. For instance, fine adjustment of the orientation of the optical element 301 in the optical element holding device with respect to the frame body 302 is required.

It is an object of the present invention to provide an optical element holding device facilitating accurate positioning of an optical element, while enabling fine orientation adjustment of the of the optical element. Another object of the present invention is to provide an exposure apparatus that improves the exposure accuracy. A further object of the present invention is to provide a method for manufacturing a device that enables highly integrated devices to be manufactured with high yield.

SUMMARY OF THE INVENTION

To achieve the above object, one aspect of the present invention provides an optical element holding device including a frame member. A holding member is provided at an inner side of the frame member and holds an optical element. An orientation adjustment mechanism is arranged between the frame member and the holding member and adjusts orientation of the optical element with respect to the frame member with six degrees of freedom by moving the holding member.

A second aspect of the present invention provides an optical element holding device including a frame member. A holding member is provided at an inner side of the frame member and holds an optical element. A displacement member is provided in the frame member and displaces in a first displacement direction by a first displacement amount. A link mechanism is provided between the frame member and the holding member and displaces in a second displacement direction, which intersects the first displacement direction, by a second displacement amount, which is less than the first displacement amount, when the displacement member displaces.

A third aspect of the present invention provides an optical element holding device for enabling fine adjustment of a position of an optical element having an optical axis and orientation of the optical axis. The optical element holding device includes an inner ring portion which supports the optical element. An outer ring portion is located on the outer side of the inner ring portion. At least three link mechanisms are provided between the inner ring portion and the outer ring portion and connect the inner ring portion and the outer ring portion. The at least three link mechanism are displaceable so as to allow the inner ring portion to move with respect to the outer ring portion with six degrees of freedom, the inner ring portion, the outer ring. The at least three link mechanism are integrally formed as a single rigid body. An adjustment mechanism is attached to the outer ring and adjusts the displacement amount of each link mechanism.

A fourth aspect of the present invention provides a barrel including said optical element holding device for holding at least one optical element.

A fifth aspect of the present invention provides an exposure apparatus including a projection optical system which transfers an image of a predetermined pattern onto a substrate. The projection optical system includes said optical element holding device for holding at least one optical element.

A sixth aspect of the present invention provides a method for manufacturing a device. The method includes a lithography step including exposure performed with the exposure apparatus.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 12A is a schematic plan view of the inner ring and arm of FIG. 2;

FIG. 12B is a partially enlarged view of FIG. 12A;

FIG. 13 is a schematic side view of the inner ring and arm of FIG. 2;

DETAILED DESCRIPTION OF THE PREFERRED EMBODIMENTS

An exposure apparatus, a barrel, and an optical element holding device according to one first embodiment of the present invention will now be described.

Figure 1:
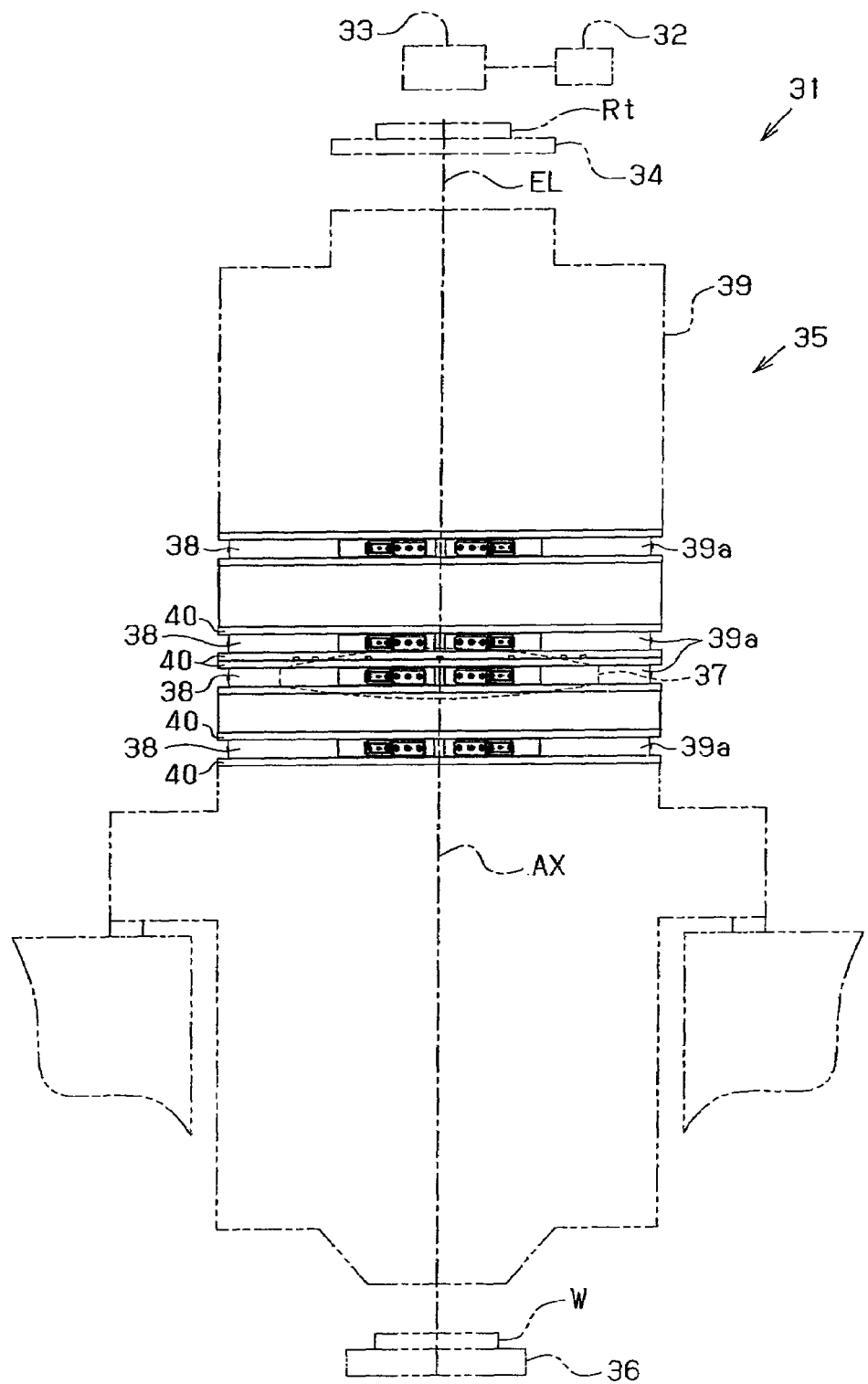
FIG. 1 is a schematic diagram of an exposure apparatus according to one embodiment of the present invention.

FIG. 1 is a schematic diagram of an exposure apparatus 31 for manufacturing a semiconductor device. The exposure apparatus 31 includes a light source 32, an illumination optical system 33, a reticle stage 34 for holding a reticle Rt serving as a mask, a projection optical system 35, and a wafer stage 36 for holding a wafer W serving as a substrate.

The light source 32 oscillates, for example, an ArF excimer laser having a wavelength of 193 nm or an $F_2$ laser having a wavelength of 157 nm. The illumination optical system 33 includes an optical integrator such as a fly eye lens or a rod lens, various lens systems such as a relay lens or a condenser lens, and an aperture. The laser light emitted from the light source 32 passes through the illumination optical system 33 to be adjusted to exposure light EL for evenly illuminating the pattern on the reticle Rt.

The reticle stage 34 includes a mounting surface on which the reticle Rt is mounted. The reticle stage 34 is arranged on the emission side of the illumination optical system 33, that is, on an object surface side (entrance side of the exposure light EL) of the projection optical system 35 so that the mounting surface is substantially orthogonal to the optical axis of the projection optical system 35.

The projection optical system 35 includes a plurality of optical elements 37 having aligned optical axes. The plurality of optical elements 37 are accommodated in a barrel 39 having a separable structure assembled by stacking a plurality of barrel modules 39a. An optical element holding device 38 holds each optical element 37 in a substantially horizontal state. The optical element holding device 38 is provided in each barrel module 39a. In the present embodiment, the barrel module 39a and the optical element holding device 38 are formed integrally with each other.

A wafer stage 36 includes a mounting surface on which the wafer W is mounted. The mounting surface of the wafer stage 36 intersects the optical axis of the projection optical system 35 on the image surface side (exit side of the exposure light EL) of the projection optical system 35. The image of the pattern on the reticle Rt illuminated by the exposure light EL is reduced by a predetermined reduction ratio when passing through the projection optical system 35 to be projected and transcribe onto the wafer W on the wafer stage 36.

Figure 2:
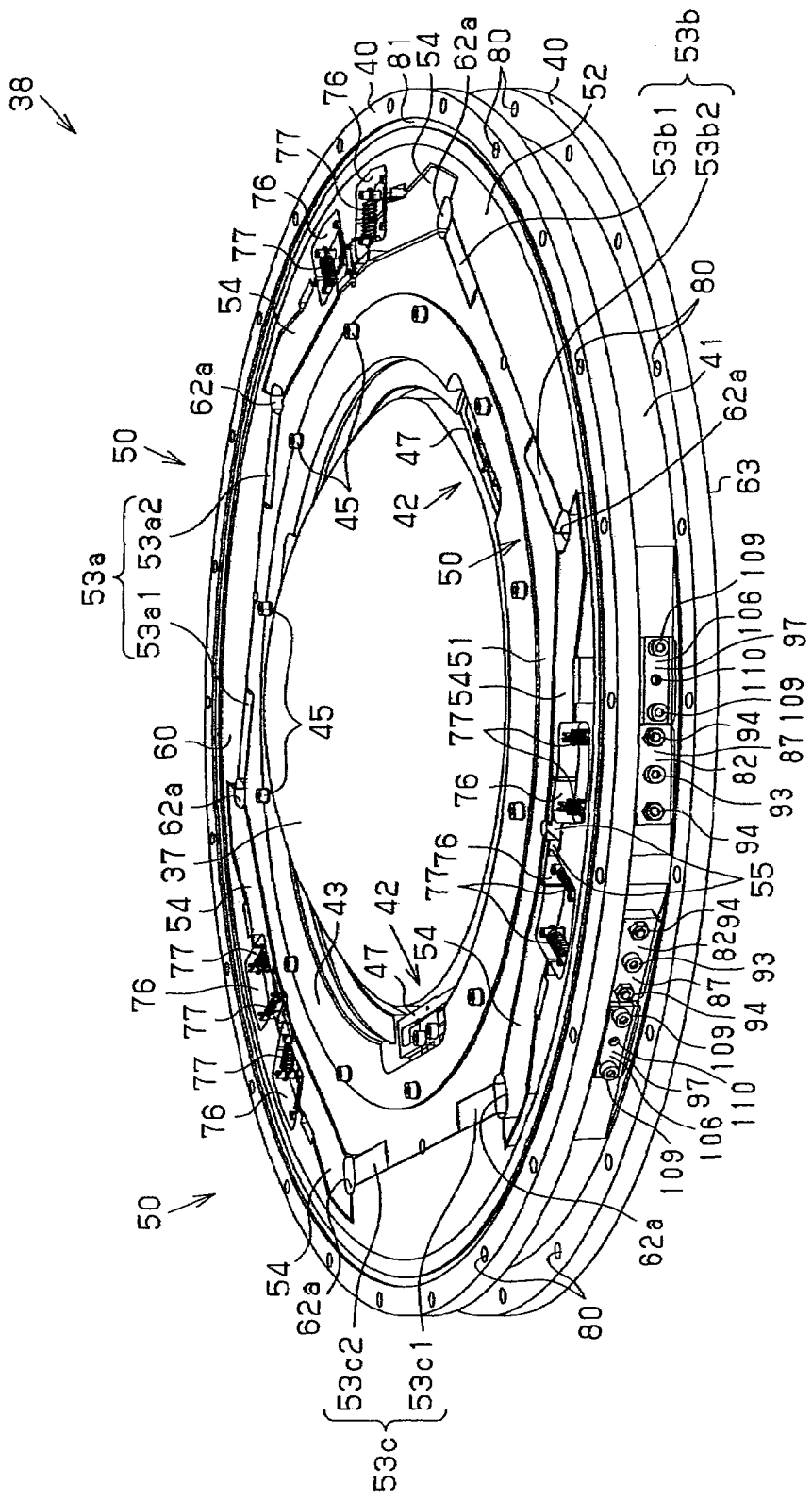
FIG. 2 is a perspective view showing an optical element holding device of FIG. 1.
Figure 3A:
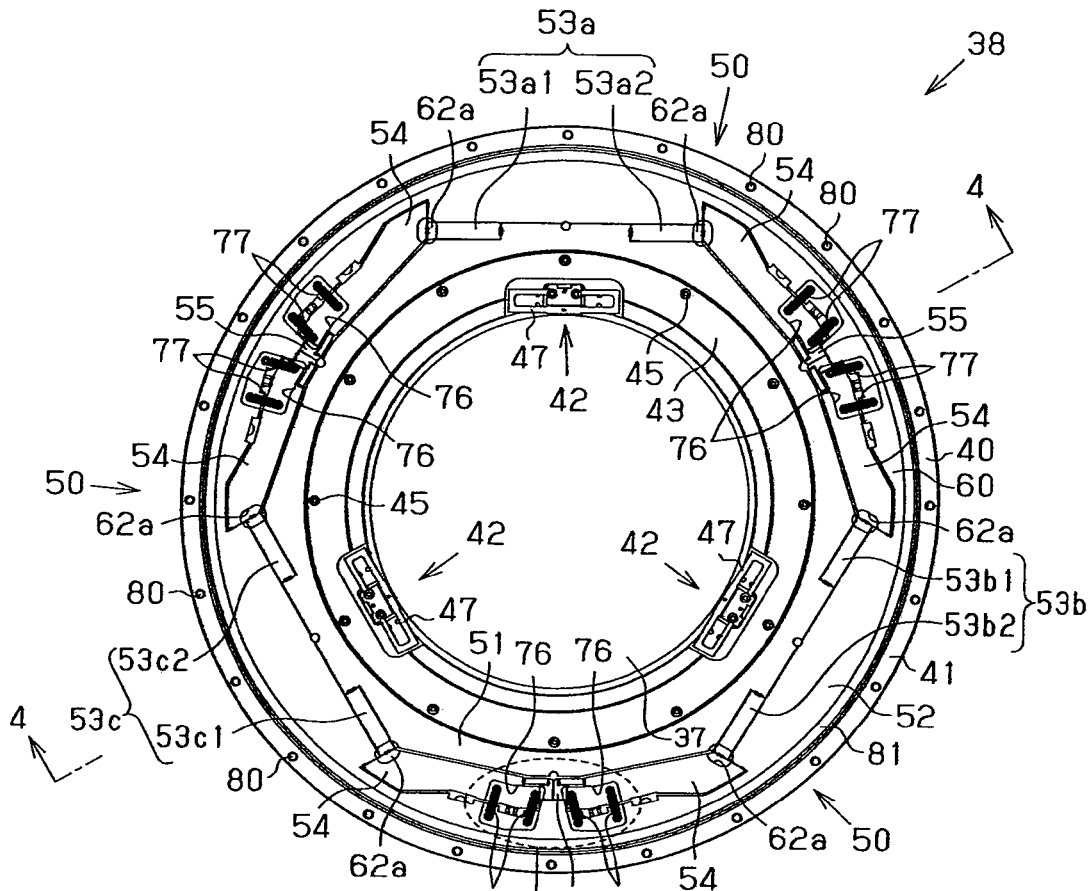
FIG. 3A is a plan view showing the optical element holding device of FIG. 1.
Figure 3B:
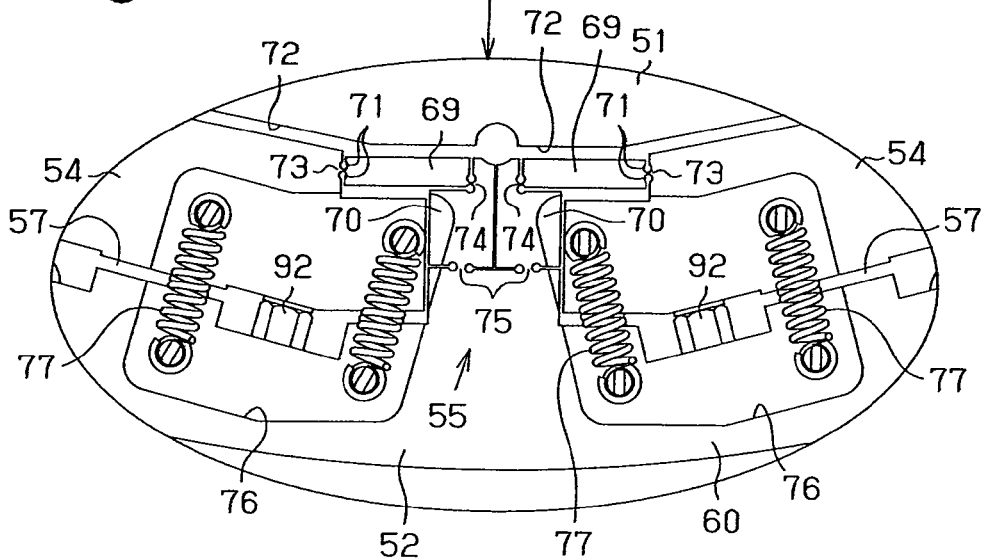
FIG. 3B is a partially enlarged view of FIG. 3A.
Figure 4:
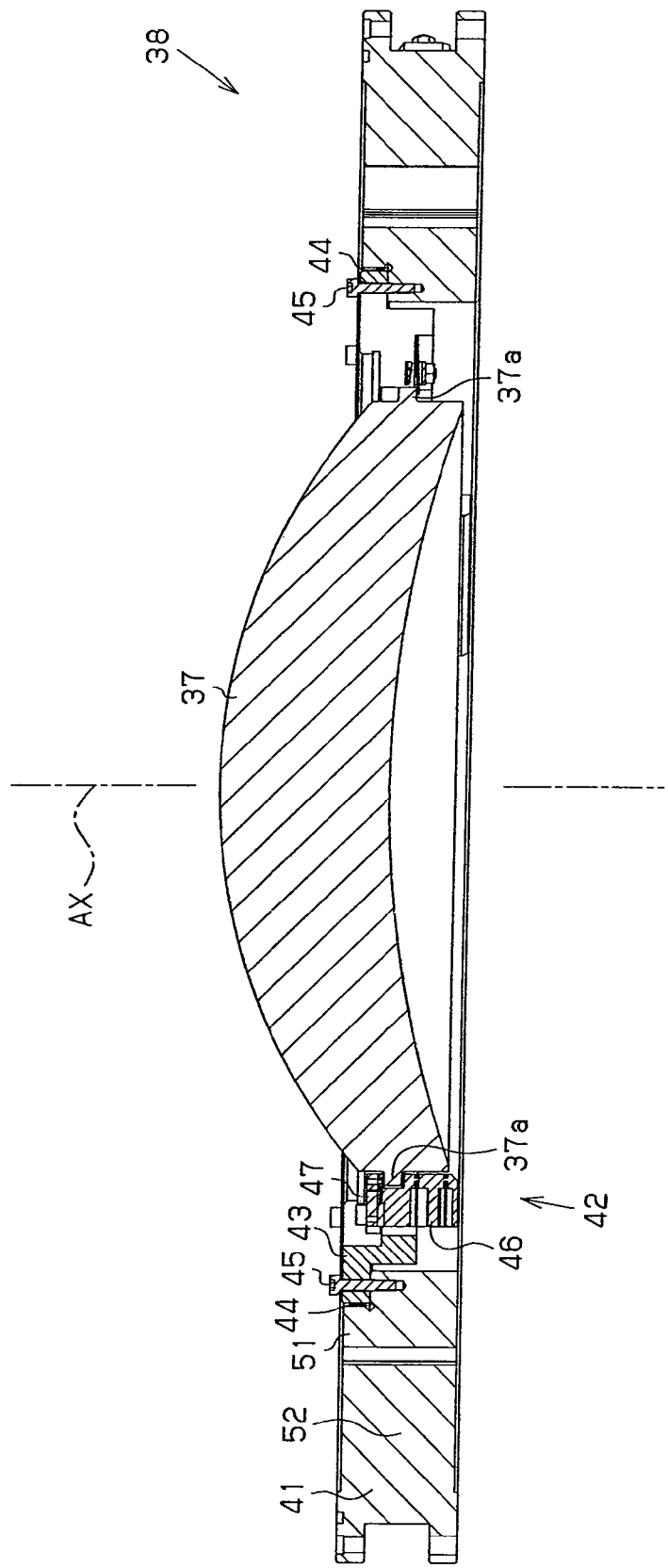
FIG. 4 is a cross-sectional view taken along line 4-4 in FIG. 3.

The optical element holding device 38 will now be described. FIG. 2 is a perspective view of the optical element holding device 38, FIG. 3A is a plan view of the optical element holding device 38, FIG. 3B is a partially enlarged view of FIG. 3A, and FIG. 4 is a cross-sectional view taken along line 4-4 in FIG. 3A. As shown in FIG. 4, the optical element 37 is made of glass material having strength that is greater than or equal to a predetermined value such as synthetic quart or fluorite. A flange 37a is formed on the peripheral portion of the optical element 37. As shown in FIG. 2, the optical element holding device 38 includes a frame member 41 having a fastening portion 40 connected to another optical element holding device (barrel module), and a lens frame body 43 for holding the optical element 37 with a support member 42.

As shown in FIG. 2 and FIG. 3A, the frame member 41 and the lens frame body 43 are both substantially annular. As shown in FIG. 4, the lens frame body 43 is provided in the inner side of the frame member 41 and fixed to a step 44 formed on the inner circumferential surface of the frame member 41 by a plurality of bolts 45. As shown in FIG. 3A, three support members 42 are arranged at equiangular intervals on the lens frame body 43.

A known optical element support member, for example, the optical element holding device disclosed in Japanese Laid-Open Patent Publication No. 2002-162549 is used as the support member 42. The support member 42 includes a base member 46 (refer to FIG. 4) and a clamp member 47, and the flange 37a of the optical element 37 is held between the base member 46 and the clamp member 47. The base member 46 has a flexure structure for absorbing factors transmitted from the external part of the support member 42 to the support member 42 and affecting the state of the optical surface of the optical element 37 (e.g., microscopic surface roughness and surface undulation of a main body of the exposure apparatus 31 and fastening portion 40 of the frame member 41). The optical surface of the optical element 37 is maintained in a satisfactory state with the optical element 37 attached to the external device by the support member 42, the lens frame body 43, and the frame member 41 due to such flexure structure.

The frame member 41 includes an inner ring 51 functioning as a holding member and an inner frame member, an outer ring 52, arms 53a1, 53a2, 53b1, 53b2, 53c1, and 53c2 functioning as a first link portion, levers 54 functioning as a second link portion, and supporting links 55 functioning as a third link portion. The arms 53a1, 53a2, 53b1, 53b2, 53c1, 53c2 and the levers 54 form an orientation adjustment mechanism 50 for adjusting the orientation of the inner ring 51 to adjust the orientation of the optical element 37. The inner ring 51, the outer ring 52, the arms 53a1, 53a2, 53b1, 53b2, 53c1, 53c2, the lever 54, and the supporting link 55 are formed on the frame member 41, which is a single structure (rigid body) formed through wire cut and electrical discharge machining. The inner ring 51 and the outer ring 52 are connected so as to be relatively movable by the arms 53a1, 53a2, 53b1, 53b2, 53c1, and 53c2 and the lever 54 or by the arms 53a1, 53a2, 53b1, 53b2, 53c1, and 53c2, the lever 54, and the supporting link 55.

As shown in FIG. 3A, the pair of arms 53a1 and arm 53a2 function as a first link mechanism 53a, the pair of arms 53b1 and arm 53b2 function as a second link mechanism 53b, and the pair of arms 53c1 and 53c2 function as a third link mechanism 53c. The first to the third link mechanisms 53a, 53b, and 53c are arranged at equiangular intervals along a circle of which the center is the optical axis AX of the optical element 37.

Figure 5:
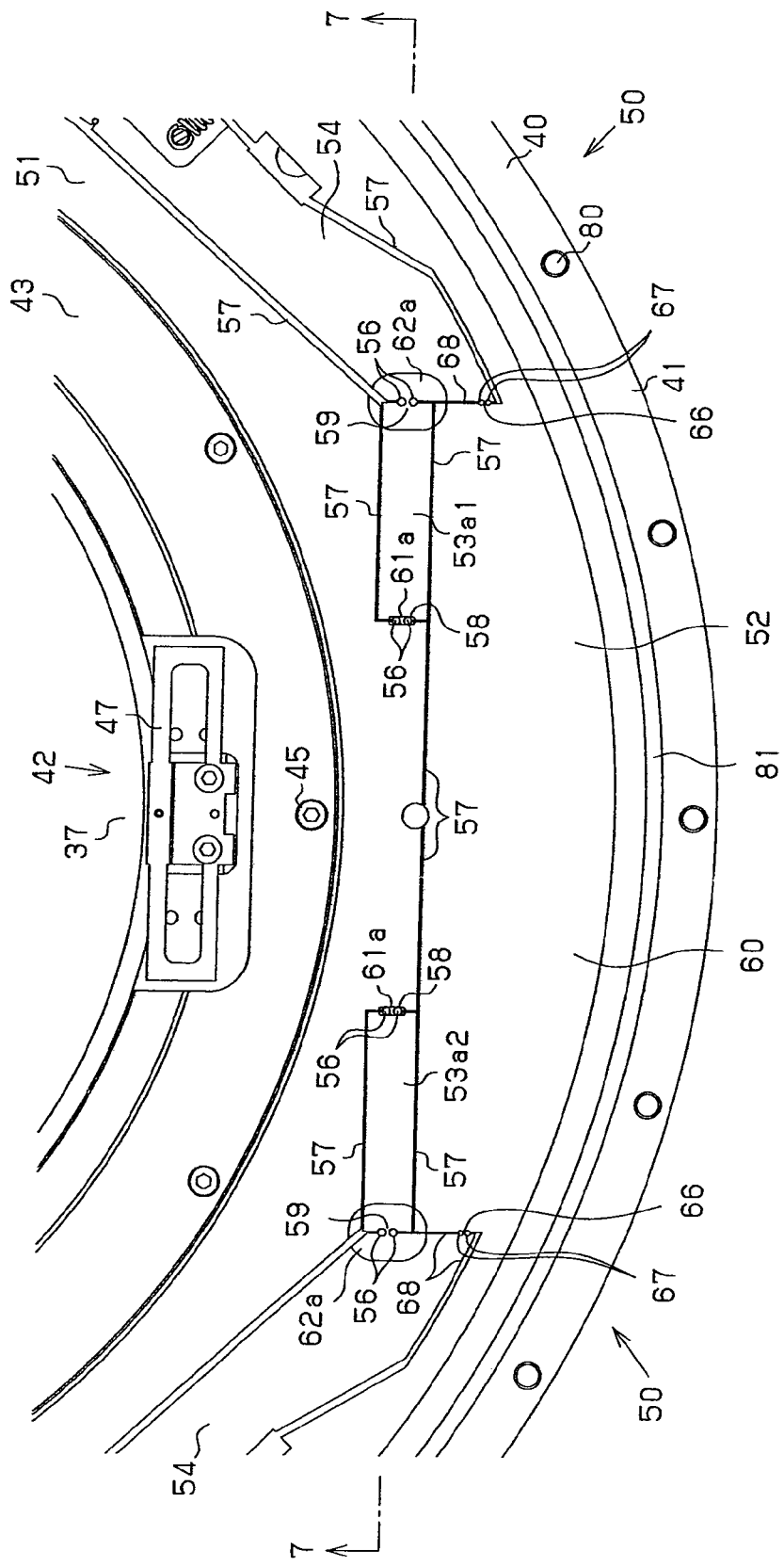
FIG. 5 is an enlarged plan view showing an arm of a frame member of FIG. 2.
Figure 6:
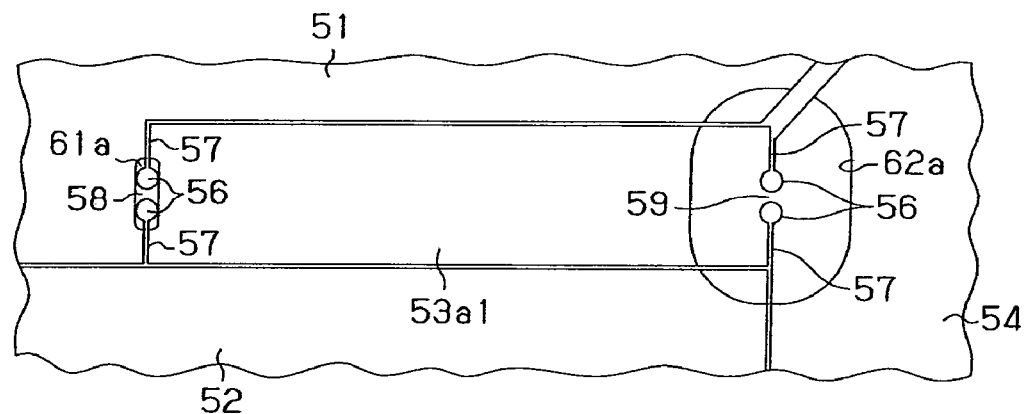
FIG. 6 is a partially enlarged view of FIG. 5.
Figure 7:
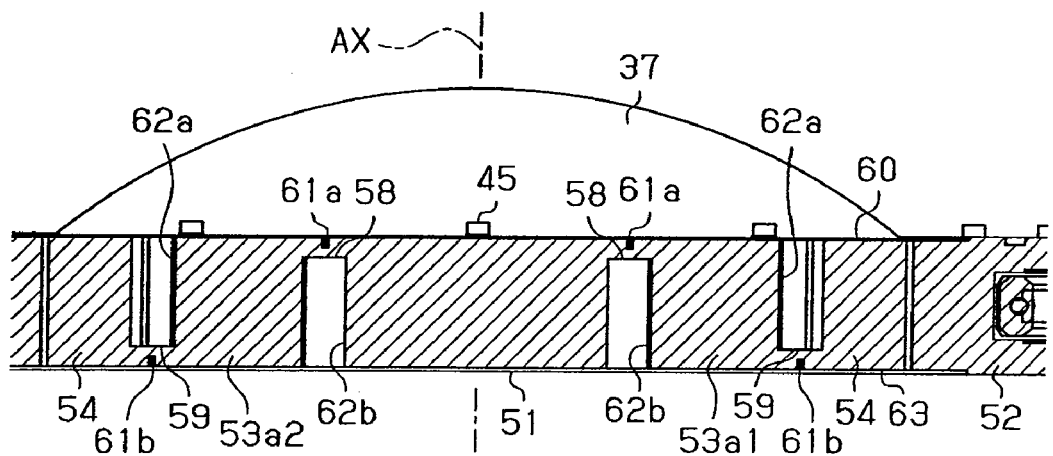
FIG. 7 is a cross-sectional view taken along line 7-7 in FIG. 5.

The first link mechanism 53a will now be described with reference to FIG. 5 to FIG. 7. The second and the third link mechanisms 53b and 53c have the same structure as the first link mechanism 53a. FIG. 5 is an enlarged view showing the vicinity of the pair of arms 53a1 and 53a2. FIG. 6 is an enlarged view of the arm 53a1. FIG. 7 is a cross-sectional view taken along line 7-7 of FIG. 5. As shown in FIG. 5 and FIG. 6, an element side pivot (first neck portion) 58 and a frame side pivot (second neck portion) 59 are respectively formed on a first end portion and a second end portion of each arm 53a1 and 53a2. Each pivot 58 and 59 is formed between a pair of through holes 56. Further, each arm 53a1 and 53a2 is defined between the pair of through holes 56 and slits 57 extending from each through hole 56. The element side pivots 58 rotatably connect the associated arms 53a1 and 53a2 to the inner ring 51. The frame side pivots 59 rotatably connect the associated arms 53a1 and 53a2 to the levers 54.

As shown in FIG. 7, the frame member 41 includes a first surface 60 and a second surface 63 that are substantially orthogonal to the optical axis AX of the optical element 37. The first surface 60 includes a small recess 61a having a center aligned with the element side pivot 58, and a large recess (cutout portion) 62a having a center aligned with the frame side pivot 59. The large recess 62a has an opening that is larger than the opening of the small recess 61a and is deeper than the small recess 61a. The small recess 61a and the large recess 62a are formed by cutting out the first surface 60 through, for example, electrical discharge machining. The second surface 63 is parallel to the first surface 60 and is located opposite to the first surface 60. The second surface 63 includes a large recess 62b having a center aligned with the element side pivot 58 and a small recess 61b having a center aligned with the frame side pivot 59. The small recess 61b and the large recess 62b are respectively similar to the small recess 61a and the large recess 62a.

The small recesses 61a, 61b are shallow, whereas the large recesses 62a, 62b are deep. The element side pivot 58 is formed in the vicinity of the first surface 60, and the frame side pivot 59 is formed in the vicinity of the second surface 63. Due to such structure, each arm 53a1, 53a2 is equivalent to a rigid body arranged in a state inclined with respect to the optical axis AX of the optical element 37 within the range of thickness of the frame member 41.

Figure 11:
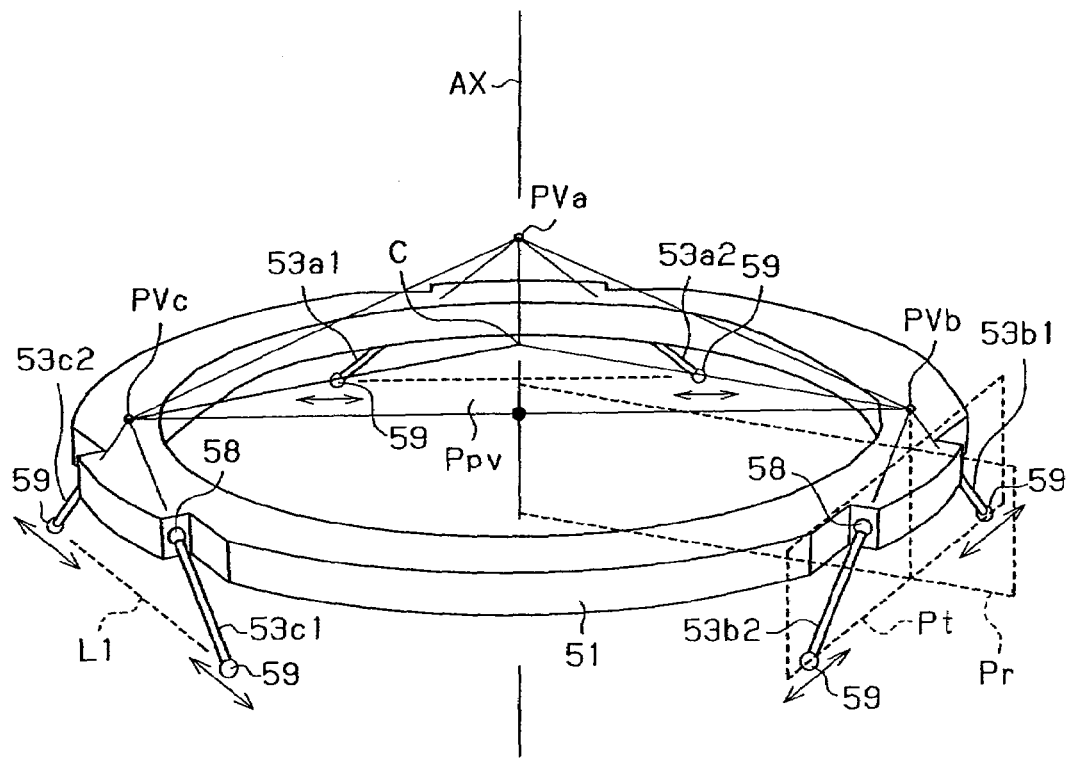
FIG. 11 is a schematic perspective view of an inner ring and arm of FIG. 2.

As shown in FIG. 11, a hypothetical line connecting the element side pivot 58 and the frame side pivot 59 lies along a tangential plane (first plane) Pt including a tangential line of a circle of which the center is the optical axis AX. The hypothetical line of the arm 53a1 and the hypothetical line of the arm 53a2 are substantially symmetric with respect to a plane, which includes the optical axis AX of the optical element 37 and which is orthogonal to the tangential plane Pt, that is, a radial plane (second plane) Pr extending in the radial direction of the optical element 37.

As shown in FIG. 3A, the levers 54 are each elongated and arranged between the first to the third link mechanisms 53a, 53b, 53c. As shown in FIG. 5, a portion close to the inner circumferential side of the frame member 41 at the first end portion of the lever 54 is rotatably connected to the second end portion of each arm 53a1, 53a2 by the frame side pivot 59. A portion close to the outer circumferential side of the frame member 41 at the first end portion of the lever 54 is rotatably connected to the outer ring 53 by a supporting point pivot 66. The supporting point pivot 66 is formed between a pair of through holes 67 extending through the frame member 41 in the thicknesswise direction. The lever 54 is defined between the pair of through holes 67 and a pair of slits 68 extending from each through hole 67 and through the frame member 41 in the thicknesswise direction. The supporting point pivot 66 is provided so that the line connecting the supporting point pivot 66 and the frame side pivot 59 is orthogonal to the line connecting the frame side pivot 59 and the element side pivot 58.

Figure 8:
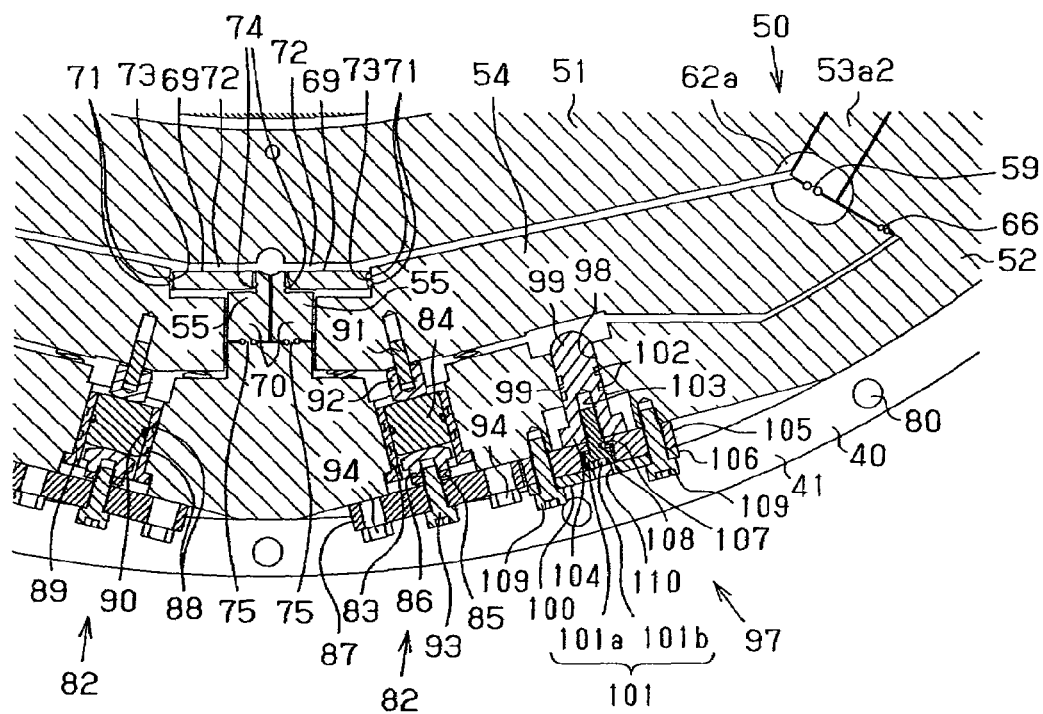
FIG. 8 is a cross-sectional view of the frame member of FIG. 2 taken along a plane orthogonal to an optical axis of the optical element.

As shown in FIG. 8, a supporting link 55 is provided in the vicinity of the second end portion of the lever 54. The supporting link 55 includes a first supporting link 69 and a second supporting link 70. The first and second supporting links 69, 70 are defined between a pair of through holes 71 extending through the frame member 41 in the thicknesswise direction and a pair of slits 72 extending from each through hole 71 and through the frame member 41 in the thicknesswise direction.

The first end portion of the first supporting link 69 is rotatably connected to the vicinity of the second end portion of the lever 54 by a distal end side supporting pivot 73. The second end portion of the first supporting link 69 is rotatably connected to the first end portion of the second supporting link 70 by an intermediate supporting pivot 74. The intermediate supporting pivot 74 connects the second supporting link 70 and the first supporting link 69 at right angle. The distal end side supporting pivot 73, the intermediate supporting pivot 74, and the supporting pivot 66 of the lever 54 are arranged along a straight line.

The second end portion of the second supporting link 70 is rotatably connected to the frame member 41 by a basal end side supporting pivot 75. The basal end side supporting pivot 75 is thicker than the distal end side supporting pivot 73 and the intermediate supporting pivot 74. Each supporting pivot 73, 74, 75 is formed between the through holes 71.

As shown in FIG. 3B, a spring accommodating recess 76 is arranged in the vicinity of the second end portion of the lever 54 at the first surface 60 of the frame member 41. A pair of biasing springs 77 are provided in each spring accommodating recess 76. Each biasing spring 77 extends between the lever 54 and the outer ring 52 and biases the second end portion of the lever 54 towards the outer ring 52. The spring accommodating recess 76 and the pair of biasing springs 77 may also be arranged on the second surface 63 of the frame member 41.

As shown in FIG. 2, a plurality of bolt holes 80 used to fasten other barrel modules 39a are formed in the fastening portion 40 of the outer ring 52. An annular groove 81 extending along the fastening portion 40 is formed in the first surface 60 of the frame member 41. An O-ring (not shown) is received in the annular groove 81 to hermetically seal the interior of the barrel 39 from the exterior with the plurality of barrel modules 39a in a stacked state.

As shown in FIG. 2 and FIG. 8, a displacement module 82 functioning as a displacement member is accommodated in a displacement module attachment hole 83 formed in a direction substantially the same as the biasing direction of the biasing spring 77 in the side surface of the outer ring 52. The displacement module 82 includes a displacement rod 84 serving as a contact portion, an adjustment washer 85, an adjustment button 86, and an adjustment base plate 87. At least one of the adjustment washers 85 or the adjustment button 86 functions as a changing member. A displacement rod housing 89 is fitted into the displacement module attachment hole 83. The displacement rod 84 is movably inserted into the displacement rod housing 89. With the two O-rings 88 attached to the external surface of the displacement rod housing 89 and the O-ring 90 arranged between the displacement rod 84 and the displacement rod housing 89, the interior of the frame member 41 is hermetically sealed from the exterior. The displacement rod 84 has a substantially circular cylinder shape having flat end surfaces. One of the end surfaces of the displacement rod 84 contacts a spherical boss 92 fixed to the vicinity of the second end portion of the lever 54 with a stud bolt 91.

The supporting bolt 93 extends through the middle of the adjustment base plate 87 to be fastened. The adjustment washer 85 and the adjustment button 86 are attached to the distal end of the supporting bolt 93. The distal end of the adjustment button 86 has a substantially spherical shape. When the adjustment base plate 87 is attached to the frame member 41 by a positioning pin 94, the distal end of the adjustment button 86 contacts the basal end surface of the displacement rod 84.

The adjustment washer 85 is selected from a plurality of washers having thicknesses different from each other by 1 μm, and the adjustment button 86 is selected from a plurality of buttons having heights different from each other by 0.1 mm. The displacement amount of the displacement rod 84 is changed in accordance with the thickness of the adjustment washer 85 and the height of the adjustment button 86. That is, the displacement force (driving force F) applied to the lever 54 by the displacement rod 84 may be changed by selecting an adjustment washer 85 from different thicknesses and an adjustment button 86 from different heights. The displacement force, which is a force generated when the attached adjustment washer 85 and adjustment button 86 are exchanged with a different adjustment washer 85 and adjustment button 86, is referred to as "driving force F". The adjustment button 86 and the adjustment washer 85 are respectively used for rough adjustment and fine adjustment of the driving force F.

As shown in FIG. 8, a jack up module 97 serving as an adjustment member is accommodated in a jack up module attachment hole 98 formed adjacent to the displacement module attachment hole 83 in the side surface of the outer ring 52. The jack up module 97 includes a jack up rod 99, a jack up housing 100, and a position adjustment screw 101.

The jack up rod 99 is movably inserted into the jack up module attachment hole 98. The interior and the exterior of the frame member 41 is maintained in an air tight manner by the O-ring arranged between the jack up rod 99 and the jack up module attachment 98. The distal end of the jack up rod 99 is spherical, and the other end is planar (hereinafter referred to as basal end surface). The distal end of the jack up rod 99 contacts the side face of the lever 54 when the jack up rod 99 is moved towards the lever 54. A threaded hole 103 extending along the longitudinal axis of the jack up rod 99 is formed in the basal end surface of the jack up rod 99. A rotation restriction portion 104 for restricting rotation of the jack up rod 99 by engaging with the inner circumferential surface of the jack up module attachment hole 98 is formed on the other end of the jack up rod 99.

The jack up housing 100 includes a holding plate 105, for holding the position adjustment screw 101 mated with the threaded hole 103 of the jack up rod 99, and a stop plate 106 for preventing the position adjustment screw 101 from falling out. A stepped accommodating hole 107 is formed in the central portion of the holding plate 105. The position adjustment screw 101 is rotatably inserted into the holding plate 105 so that the head 101a of the position adjustment screw 101 is engaged with a stepped portion 108 of the accommodating hole 107. A wrench hole 101b for receiving a jig, such as a hexagonal wrench, is formed in the head 101a of the position adjustment screw 101. A through hole 110 formed in the central portion of the stop plate 106 enables the jig to be inserted into the wrench hole 101b of the position adjustment screw 101 in a state in which the stop plate 106 and the holding plate 105 are joined and fixed to the frame member 41 by the bolt 109. The diameter of the opening of the through hole 110 is smaller than the diameter of the head 101a of the position adjustment screw 101. The position adjustment screw 101 is thus prevented from falling out by fixing the stop plate 106, which is joined with the holding plate 105, to the frame member 41.

The operation of the optical element holding device 38 will now be described using models shown in FIG. 9 to FIG. 13.

Figure 9:
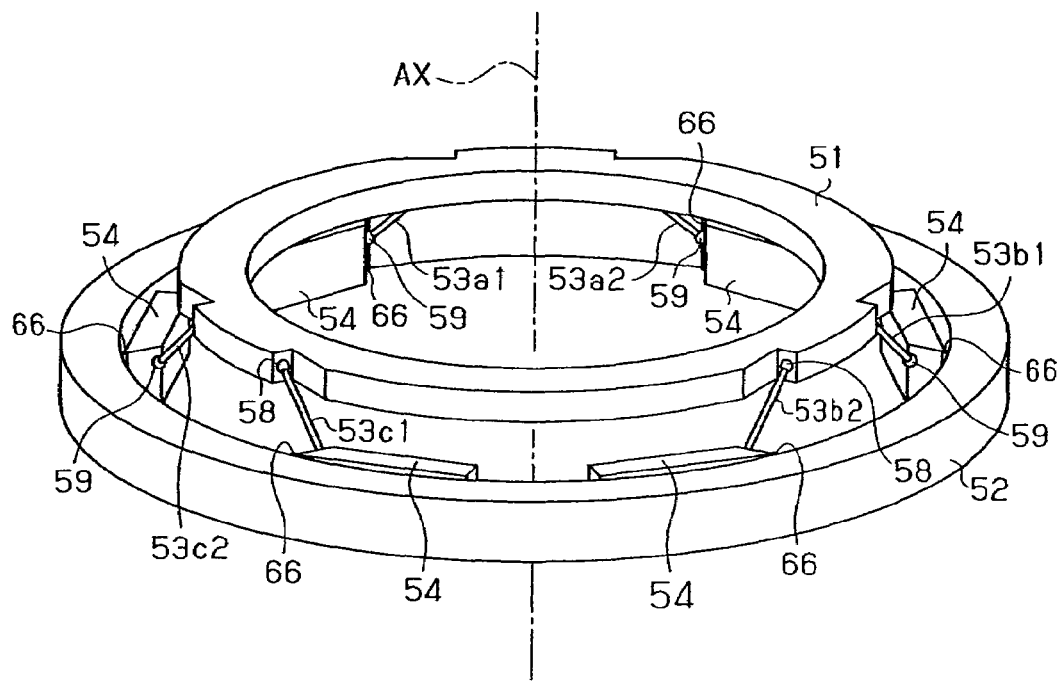
FIG. 9 is a schematic perspective view of each link mechanism of FIG. 2.
Figure 10:
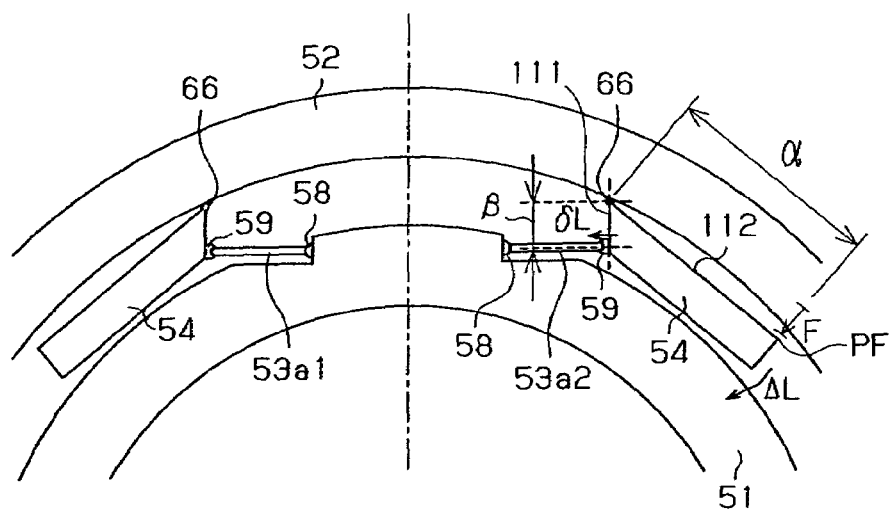
FIG. 10 is an enlarged plan view showing a first link mechanism of FIG. 9.

In FIG. 9, the arms 53a1, 53a2, 53b1, 53b2, 53c1, 53c2 are shown as six rigid shafts, and the inner ring 51, the outer ring 52, and each lever 54 are shown in a simple form. FIG. 10 is an enlarged view of the first link mechanism 53a of FIG. 9.

As shown in FIG. 9, each arm 53a1, 53a2, 53b1, 53b2, 53c1, 53c2 is rotatably connected to the inner ring 51 and rotatably connected to the first end portion of each lever 54. Further, the lever 54 is rotatably connected to the outer ring 52. Thus, the orientation of the inner ring 51 is adjustable with six degrees of freedom with respect to the outer ring 52. In other words, the inner ring 51 is kinematically supported with respect to the outer ring 52 by the arms 53a1, 53a2, 53b1, 53b2, 53c1, 53c2 and the levers 54.

The second end portion of each arm 53a1, 53a2, 53b1, 53b2, 53c1, 53c2 is connected to each lever 54. When the displacement rod 84 is displaced in the displacement rod housing 89, the lever 54 is displaced. The displacement is conveyed to the inner ring 51 without any backlash or hysteresis. The orientation of the inner ring 51 is changed without any backlash or hysteresis due to the cooperating action of the six arms 53a1, 53a2, 53b1, 53b2, 53c1, 53c2. The orientation of the inner ring 51 is changed in accordance with the change in the inclination angle of each arm 53a1, 53a2, 53b1, 53b2, 53c1, 53c2. Further, an unpredictable distortion does not occur even if the inclination angle of each arm 53a1, 53a2, 53b1, 53b2, 53c1, 53c2 changes. Therefore, the orientation of the inner ring 51 may be calculated from the displacement amount of each arm 53a1, 53a2, 53b1, 53b2, 53c1, 53c2.

The optical element 37 is held in the inner ring 51 by the support members 42 of the optical element holding device 38. The orientation of the optical element 37 is adjusted by adjusting the orientation of the inner ring 51. To prevent unpredictable distortion of the optical element 37, it is important that distortion does not occur in the inner ring 51 when changing the orientation of the inner ring 51. Adjusting the orientation of the inner ring 51 without involving backlash or hysteresis is essential in adjusting the orientation of the optical element 37 with high accuracy.

The orientation adjustment of the inner ring 51 will now be described in detail. FIG. 11 schematic shows the inner ring 51 and the arms 53a1, 53a2, 53b1, 53b2, 53c1, 53c2. FIG. 12A is a plan view of FIG. 11.

As shown in FIG. 12A, the three link mechanisms 53a, 53b, 53c formed by six arms 53a1, 53a2, 53b1, 53b2, 53c1, 53c2 are arranged at equiangular intervals along a circle of which the center is the optical axis AX of the optical element 37. As shown in FIG. 11, each pair of arms 53a1 and 53a2, 53b1 and 53b2, and 53c1 and 53c2 is parallel to the optical axis AX and arranged along a tangential plane Pt including the tangential line of the circle. That is, two arms 53a1 and 53a2, 53b1 and 53b2, and 53c1 and 53c2 are not arranged at a skew position and the extended line of the arm (53b1, 53c1) and the extended line of the arm 53a2 (53b2, 53c2) always intersect in the associated tangential plane Pt. Further, each of the arms 53a1 and 53a2, 53b1 and 53b2, and 53c1 and 53c2 are symmetric with respect to the radial plane Pr including the optical axis AX and are orthogonal to the tangential plane Pt.

As shown in FIG. 11, an intersection line of a plane, which extends through the frame side pivot 59 of the two arms 53a1 and 53a2 (53b1 and 53b2, 53c1 and 53c2) and which is orthogonal to the optical axis AX of the optical element 37, and the tangential plane Pt is defined as a drive line L1. The inner ring 51 is displaced by moving each frame side pivot 59 along the drive line L1.

As shown in FIG. 11, the intersection of the extended lines of both arms 53a1, 53a2 of the first link mechanism is assumed as a first hypothetical pivot PVa. The intersection of the extended lines of both arms 53b1, 53b2 of the second link mechanism is assumed as a second hypothetical pivot PVb. The intersection of the extended lines of both arms 53c1, 53c2 of the third link mechanism is assumed as a third hypothetical pivot PVc. The plane including the three hypothetical pivots PVA, PVb, PVc is referred to as a pivotal plane Ppv. As apparent from FIG. 11, the pivotal plane Ppv is orthogonal to the optical axis AX of the optical element 37 when it does not displace each frame side pivot 59 of each arm 53a1, 53a2, 53b1, 53b2, 53c1, 53c2 (reference state). The center of a circle extending through the three hypothetical pivots PVa, PVb, PVc on the pivotal plane Ppv is referred to as an observation point C. The observation point C lies on the optical axis AX of the optical element 37 in the reference state.

The orthogonal coordinate system will now be defined. The broken lines in FIGS. 12A, 12B show the reference state. The position of the observation point C in the reference state is referred to as the origin point. The direction of the normal line of the tangential plane Pt corresponding to the first link mechanism 53a is the Y-axis. The direction from the origin towards the tangential plane Pt is the positive direction. The X-axis is orthogonal to the Y-axis on the pivotal plane Ppv. The optical axis Ax of the optical element 37 is the Z-axis. The upward direction in the Z-axis is the positive direction.

The six degrees of freedom for orientation adjustment of the inner ring 51 with respect to the outer ring 52 includes three degrees of freedom for parallel movement (shift movement) along each axis, and three degrees of freedom of rotation about each axis in the orthogonal coordinate system. The rotation about the Z-axis is rotation of the pivotal plane Ppv, whereas the rotation about the X-axis and the rotation about the Y-axis are related to the tilt of the pivotal plane Ppv.

When each frame side pivot 59 is displaced, the orientation of the inner ring 51 changes and the observation point C is displaced. When the displacement component of the observation point C along each axis direction is dx, dy, dz, the orientation adjustment of the optical element 37 for performing aberration control of the projection optical system 35 is performed by displacing each optical element 37 in an extremely fine manner. When the displacement is extremely fine, the change in orientation of the inner ring 51 may be linearly decomposing into rotation amounts $d\theta x$, $d\theta y$, $d\theta z$ about each axis of X, Y, Z. The symbol of the rotation about each coordinate axis complies with the right hand corkscrew rule with respect to the positive direction of each coordinate axis. That is, the rightward (clockwise) rotation when seen in the positive direction of each coordinate axis is positive. From the above definition, the orientation change vector $\Delta I$ of the inner ring 51 is expressed as equation (1).

$$\Delta \vec{I} = (dx\ dy\ dz\ d\theta x\ d\theta y\ d\theta z)^T \quad (1)$$

The superscript T indicates that a 6×1 matrix is transposed so as to be written in one line.

The displacement of each frame side pivot 59 that occurs with the change of inclination angle of each arm is only movable in a straight line along the drive line L1 and the degree of freedom is 1. When defining the displacement amount of the six frame side pivots 59 as $\delta 1$ to $\delta 6$, the input displacement vector $\Delta p$ with respect to the inner ring 51 is expressed as equation (2).

$$\Delta \vec{p} = (\delta 1\ \delta 2\ \delta 3\ \delta 4\ \delta 5\ \delta 6)^T \quad (2)$$

Since the displacement of each frame side pivot 59 is linearly conveyed to the inner ring 51 without backlash or hysteresis as mentioned above, the orientation change vector $\Delta I$ of the inner ring 51 and the input displacement vector $\Delta p$ corresponds at 1:1. Thus, the relationship between the input displacement vector $\Delta p$ and the orientation change vector $\Delta I$ is a linear transformation. Assuming that the transformation matrix is A (6×6 matrix), the orientation change vector $\Delta I$ is expressed as equation (3).

$$\Delta \vec{I} = A \Delta \vec{p} \quad (3)$$

The transformation matrix A is expressed as equation (4).

$$A = (\vec{a}_1\ \vec{a}_2\ R\vec{a}_1\ R\vec{a}_2\ R^2\vec{a}_1\ R^2\vec{a}_2) \quad (4)$$

where $$\vec{a_1} = \left(-\frac{1}{3}\ 0\ \frac{1}{6\tan\theta}\ \frac{1}{3r\tan\theta}\ 0\ \frac{1}{6r}\right)^T \quad (5)$$

$$\vec{a_2} = \left(\frac{1}{3}\ 0\ \frac{1}{6\tan\theta}\ \frac{1}{3r\tan\theta}\ 0\ -\frac{1}{6r}\right)^T \quad (6)$$

R is a 120° rotation matrix about the Z-axis, $\theta$ is the angle formed by each arm 53a1, 53a2, 53b1, 53b2, 53c1, 53c2 and the drive line L1, and r is the radius of the arrangement circle of the hypothetical pivot PVa, PVb, PVc of which the center is the optical axis AX of the optical element 37. The orientation adjustment precision, the resolution, and the movable range of the inner ring 51 are optimized by appropriately defining the angle θ and the 120° rotation matrix R.

The transformation matrix A is easily formulated by a geometric observation, and an inverse matrix exists for the transformation matrix A. Therefore, equation (3) may be transformed to equation (7).

$$\Delta \vec{p} = A^{-1} \Delta \vec{I} \quad (7)$$

Thus, in the optical element holding device 38, the driving amount of each frame side pivot 59, that is, the input displacement vector Δp for accomplishing the orientation change vector ΔI of the optical element 37 determined in terms of optical adjustment of the projection optical system 35 is obtained by a simple calculation.

The driving method of each frame side pivot 59 will now be described.

As shown in FIG. 9 and FIG. 10, six levers 54 are each connected to the inner side of the outer ring 52 by a supporting point pivot 66. Each lever 54 is rotatable in the plane orthogonal to the optical axis AX of the optical element 37 about the associated supporting point pivot 66. The associated arms 53a1, 53a2, 53b1, 53b2, 53c1, 53c2 are connected to the one end portion of each lever 54 that is connected to the supporting point pivot 66 by the frame side pivot 59. The lever 54 is arranged so that the frame side pivot 59 is displaced within the associated tangential plane Pt. The end portion different from the one end portion connected to the supporting point pivot 66 in the longitudinal direction of the lever 54 (other end portion, diagonal position of the frame side pivot 59) is a force point PF of the lever 54. When the drive force F is externally applied to the force point PF, the lever 54 is rotated about the supporting point pivot 66.

As shown in FIG. 10, the lever 54 has a geometric plane shape equivalent to a trapezoid. The oblique line 111 between the supporting point pivot 66 and the frame side pivot 59 is substantially perpendicular to the tangential plane Pt. The length of the side 112 on the outer ring 52 side of the lever 54, that is, the distance between the supporting point pivot 66 and the power force PF is represented by α, and the length of the oblique line 111 is represented by β. When the driving displacement ΔL is applied to the force point PF, the displacement amount β/L of the frame side pivot 59 becomes β/α×ΔL. That is, the driving displacement ΔL applied to the force point PF is always reduced by β/α times and conveyed due to the shape of the lever 54. Since the externally applied displacement is reduced and conveyed to each arm 53a1, 53a2, 53b1, 53b2, 53c1, 53c2 and the inner ring 51, the orientation adjustment of the optical element 37 is performed with high accuracy and high resolution. The lever 54 converts the displacement in the radial direction of the optical element 37 by the drive force F to displacement along the tangential line direction of the optical element 37.

If the lever 54 is supported by the outer ring 52 only with the supporting point pivot 66, the supporting rigidity may become insufficient. As shown in FIG. 8, in the present embodiment, the other end portion of the lever 54 opposite the one end portion connected to the supporting point pivot 66 in the longitudinal direction of the lever 54 is supported by the outer ring 52 with the supporting link 55. The lever 54 is supported at two sides by the outer ring 52 and thus stably supported with sufficient rigidity.

The first supporting link 69 of the supporting link 55 is arranged along an extension of the line connecting the supporting point pivot 66 and the distal end side supporting pivot 73. Thus, when the drive force F is applied to the force point PF and the one end portion of the lever 54 is pivoted about the supporting point pivot 66, the lever 54 is stably rotated by the displacement of the supporting link 55. By having the basal end side supporting pivot 75 supporting the second supporting link 70 at the outer ring 52 be thicker than the other supporting pivots 73, 74 of the supporting link 55, the supporting rigidity of the lever 54 is further increased without affecting the rotation performance of the lever 54.

The operation of adjusting the orientation of the optical element 37 will now be described.

First, the jig is engaged with the wrench hole of the position adjustment screw 101 of the jack up module 97. The jig is used to rotate the position adjustment screw 101 until the distal end of the jack up rod 99 contacts the lever 54. The adjustment base plate 87 in the displacement module 82 is then removed from the frame member 41. This eliminates the pressing force applied from the displacement rod 84 to the spherical boss 92 and releases the driving displacement ΔL of the force point PF of the lever 54. The biasing force of the biasing spring 77 rotates the lever 54 toward the outer ring 52. However, the lever 54 is in contact with the jack up rod 99. Thus, the lever 54 is arranged at a predetermined position without contacting the inner circumferential surface of the outer ring 52.

In this state, the adjustment washer 85 and the adjustment button 86 are removed from the frame member 41 along with the adjustment base plate 87. The displacement rod 84 is kept in the displacement module attachment hole 83 by the displacement rod housing 89 even if the adjustment washer 85 and the adjustment button 86 are removed. The O-rings 88, 90 are respectively arranged between the displacement rod 84 and the displacement rod housing 89 and between the displacement rod housing 89 and the inner circumferential surface of the displacement module attachment hole 83. This keeps the optical element holding device 38 hermetically sealed even if the adjustment washer 85 and the adjustment button 86 are removed.

The adjustment washer 85 and the adjustment button 86 are exchanged with those having the appropriate thickness, and the adjustment base plate 87 is attached to the frame member 41. The position of the displacement rod 84 in the displacement module attachment hole 83 is changed in accordance with the thickness of the adjustment washer 85 and the adjustment button 86. The displacement of the displacement rod 84 changes the position of the spherical boss 92, changes the pressing force with respect to the force point PF of the lever 54, and the driving displacement ΔL is applied to the lever 54. When the lever 54 is rotated by the driving displacement ΔL, the frame side pivot 59 of each arm 53a1, 53a2, 53b1, 53b2, 53c1, 53c2 is displaced along the associated drive line L1.

The driving displacement ΔL applied by the displacement module 82 is reduced by a predetermined scale and conveyed to each frame side pivot 59. The displacement of each arm 53a1, 53a2, 53b1, 53b2, 53c1, 53c2 is synthesized in the inner ring 51 by each element side pivot 58. For example, this changes the orientation of the inner ring 51 from the orientation in which the upper surface shown by broken lines in FIG. 12A and FIG. 13 lies along a plane orthogonal to the optical axis of the optical element 37 to the orientation in which the upper surface shown by solid lines is inclined with respect to the optical axis AX. The orientation of the optical element 37 is adjusted as the orientation of the inner ring 51 changes.

The orientation change of the inner ring 51 will be briefly be described in relation with the displacement of each arm 53a1, 53a2, 53b1, 53b2, 53c1, 53c2.

For example, if the frame side pivot 59 of each of the pairs of arms 53a1 and 53a2, 53b1 and 53b2, 53c1 and 53c2 is displaced by the same displacement amount so as to move closer to each other in each of the link mechanisms 53a, 53b, 53c, the inner ring 51 is moved upward in a parallel manner along the optical axis AX of the optical element 37 by the element side pivot 58. On the other hand, if the frame side pivot 59 of each of the pairs of arms 53a1 and 53a2, 53b1 and 53b2, 53c1 and 53c2 is displaced by the same displacement amount so as to move away each other, the inner ring 51 is moved downward in a parallel manner in the optical axis direction of the optical element 37 by the element side pivot 58. Further, if each frame side pivot of each of the pairs of arms 53a1 and 53a2, 53b1 and 53b2, 53c1 and 53c2 is displaced by the same displacement amount in the same direction, the inner ring 51 is rotated within a plane orthogonal to the optical axis AX of the optical element by the element side pivot 58. If the displacement amount of each frame side pivot 59 differs among the plurality of link mechanisms 53a, 53b, 53c, the inner ring 51 may be inclined at a desired angle with respect to the optical axis AX of the optical element 37 by the element side pivot 58.

In this manner, the optical element 37 may be adjusted to any orientation by respectively setting the displacement amount of each frame side pivot 59 of the six arms 53a1, 53a2, 53b1, 53b2, 53c1, 53c2. The displacement amount of each frame side pivot 59 is determined in accordance with the driving displacement ΔL in the displacement module 82, which engages the frame side pivot 59 with the lever 54. The driving displacement ΔL is easily adjusted by changing the thickness of the adjustment washer 85 and the adjustment button 86 included in the displacement module 82.

The present embodiment has the advantages described below.

(1) The optical element holding device 38 includes the frame member 41 and the support member 42 for holding the optical element 37 at the inner side of the frame member 41. The orientation adjustment mechanism 50 enabling orientation adjustment of the support member 42 and the optical element 37 with six degrees of freedom with respect to the frame member 41 is provided between the frame member 41 and the support member 42. The orientation adjustment of the optical element 37 is enabled in a state in which the optical element 37 is attached to the barrel 39. The optical element 37 may be easily and accurately positioned. Further, the optical surface of the optical element 37 may be adjusted in a satisfactory state irrespective of the surface accuracy of the fastening portion 40 of the frame member 41 even when stacking the barrel module 39a to form the barrel 39. When accommodating the frame member 41 in the barrel, the optical surface of the optical element 37 is maintained in a satisfactory state irrespective of the shape of the inner circumferential surface of the barrel to which the frame member 41 is attached. The relative position of each optical element 37 is finely adjusted with the optical element 37 accommodated in the barrel 39. Therefore, the optical element holding device 38 improves the optical performance of the projection optical system 35.

(2) The inner ring 51 for holding the lens frame body 43, to which the optical element 37 is attached, the outer ring 52 on the fixed side, and the orientation adjustment mechanism 50 provided between the two rings 51, 52 are formed integrally as a single structure. Therefore, the orientation adjustment of the optical element 37 is performed without increasing the number of components and enlarging the apparatus. Since the orientation adjustment mechanism 50 is formed by a single structure, there is no backlash or hysteresis during the operation. Therefore, the optical element holding device 38 performs orientation adjustment of the optical element 37 with high accuracy.

(3) The orientation adjustment mechanism 50 includes six arms 53a1, 53a2, 53b1, 53b2, 53c, 53c2 each having a first end portion rotatably connected to the inner ring 51. The second end portion of each arm 53a1, 53a2, 53b1, 53b2, 53c, 53c2 is displaced by the rotation of the lever 54. When driving force is applied to the lever 54, the second end portion of each arm 53a1, 53a2, 53b1, 53b2, 53c, 53c2 is displaced, and the orientation of the optical element 37 is adjusted in accordance with the displacement. The optical element 37 is kinematically held by interlocking each of the six arms 53a1, 53a2, 53b1, 53b2, 53c, 53c2. Thus, the orientation of the optical element 37 is adjusted freely and with high accuracy. (4) The six arms 53a1, 53a2, 53b1, 53b2, 53c, 53c2 form three link mechanisms 53a, 53b, 53c. Each link mechanism 53a, 53b, 53c is arranged in predetermined intervals along a circle of which the center is the optical axis AX of the optical element 37 in the tangential plane Pt including the tangential line of the circle of which the center is the optical axis AX. The two arms 53a1 and 53a2 (53b1 and 53b2, 53c1 and 53c2) of each link mechanism 53a, 53b, 53c are substantially symmetric with respect to the radial plane Pr, which includes the optical axis AX and which is orthogonal to the tangential plane Pt. Thus, the optical element 37 is kinematically held with a simple structure.

(5) The frame member 41 includes a first surface 60, which is substantially orthogonal to the optical axis AX of the optical element 37, and a second surface 63, which is substantially parallel to the first surface 60. Each arm 53a1, 53a2, 53b1, 53b2, 53c, 53c2 includes an element side pivot 58 and a frame side pivot 59. The element side pivot 58 is formed by a small recess 61a cut out from the first surface 60 and is connected to the inner ring 51. The frame side pivot 59 is formed by a small recess 61b cut out from the second surface 63. Thus, the inner ring 51 holding the lens frame body 43 and the arm 53a1, 53a2, 53b1, 53b2, 53c, 53c2 for kinematically holding the inner ring 51 are easily formed as a single structure (frame member 41).

(6) The orientation adjustment mechanism 50 is provided in the frame member 41 and includes the displacement module 82, which is displaced by the driving force F, and a lever 54, of which first end portion is rotatably attached to the outer ring 52 and second end portion is engaged with the displacement module 82. The second end portion of each arm 53a1, 53a2, 53b1, 53b2, 53c, 53c2 is rotatably connected to the lever 54. By displacing the displacement module 82, the lever 54 is rotated with respect to the outer ring 52, and the second end portion of each arm 53a1, 53a2, 53b1, 53b2, 53c, 53c2 is displaced by the rotation of the lever 54. This converts the displacement of the displacement module 82 to a predetermined displacement with the lever 54 that is conveyed to the arms 53a1, 53a2, 53b1, 53b2, 53c, 53c2. Therefore, the degree of freedom of design in the arms 53a1, 53a2, 53b1, 53b2, 53c, 53c2 is improved.

(7) The supporting point pivot 66, which is an attachment portion of the lever 54 and the outer ring 52, is formed between the two through holes 56 extending in the thicknesswise direction of the lever 54. The lever 54 is thus rotatably connected to the outer ring 52 with a simple structure.

(8) The displacement module 82 includes the displacement rod 84, which contacts the lever 54, and the adjustment button 86 and adjustment washer 85 for changing the displacement amount of the lever 54 resulting from the driving force F. The predetermined driving force F applied by the displacement module 82 is thus conveyed to the lever 54 by the displacement rod 84. The lever 54 is then rotated by the conveyed driving displacement ΔL, and the inclination angle of each arm 53$a$1, 53$a$2, 53$b$1, 53$b$2, 53$c$, 53$c$2 is changed to adjust the orientation of the inner ring 51. The driving displacement ΔL conveyed to the lever 54 may be changed in any manner by the adjustment washer 85 and the adjustment button 86. Thus, the orientation of the inner ring 51, that is, the optical element 37, is adjusted with high accuracy.

(9) In the optical element holding device 38, the displacement module 82 is provided in the frame member 41. The lever 54 and the first to the third link mechanism 53$a$, 53$b$, 53$c$ are provided between the outer ring 52 and the inner ring 51 of the frame member 41. The lever 54 and the first to the third link mechanisms 53$a$, 53$b$, 53$c$ reduce the displacement amount from the displacement module 82 and are displaced in a direction intersecting the displacement direction of the displacement module 82.

Thus, the optical element 37 may be adjusted to any orientation by the lever 54, each link mechanism 53$a$, 53$b$, 53$c$, and the inner ring 51 by displacing the displacement module 82 in a state in which the optical element 37 is attached to the barrel 39. This easily and accurately positions the optical element 37, and the optical surface of the optical element 37 is adjusted to a satisfactory state irrespective of the surface precision of the frame member 41. Even if the frame member 41 is accommodated in the barrel 39, the optical surface of the optical element 37 is adjusted to a satisfactory state irrespective of the shape of the inner circumferential surface of the barrel 39 to which the frame member 41 is attached.

The driving force F based on the displacement of the displacement module 82 is reduced by the lever 54 and each link mechanism 53$a$, 53$b$, 53$c$ and conveyed to the inner ring 51. Thus, the optical element 37 is finely adjusted so as to have a desired orientation. Therefore, the relative position of each optical element 37 is finely controlled with the optical element 37 accommodated in the barrel 39.

(10) In the optical element holding device 38, the first end portions of the arms 53$a$1, 53$a$2, 53$b$1, 53$b$2, 53$c$, 53$c$2 are rotatably attached to the inner ring 51. The lever 54 has the first end portion rotatably attached to the outer ring 52 and the second end portion engaged with the displacement module 82. The second end portions of the arm 53$a$1, 53$a$2, 53$b$1, 53$b$2, 53$c$, 53$c$2 are rotatably connected to the lever 54. Thus, the rotation of the lever 54 changes the direction of the driving force F applied to the lever 54 by the displacement of the displacement module 82 while conveying it to the inner ring 51 through the arms 53$a$1, 53$a$2, 53$b$1, 53$b$2, 53$c$, 53$c$2. When adjusting the orientation of the optical element 37 with the driving force F, the degree of freedom of design in the conveying configuration of the driving force F is increased. The conveying configuration of the driving force F is simple.

(11) The driving force F in the radial direction of the optical element 37 is applied to the second end portion of the lever 54 by the displacement of the displacement module 82. The frame side pivot 59 of the arm 53$a$1, 53$a$2, 53$b$1, 53$b$2, 53$c$, 53$c$2 is moved within the tangential plane Pt of the optical element 37 by the lever 54 due to the driving displacement ΔL from the displacement module 82. By applying the driving force F in the radial direction of the optical element 37 to the lever 54, the open area of the opening (displacement module attachment hole 83) for applying the driving force F to the frame member 41 becomes smaller than when applying the driving force in the circumferential direction of the optical element 37. Thus, the sealing structure for obtaining a hermetic seal around the displacement rod 84 and the displacement module 82 for conveying the driving force F is simplified. Further, the degree of freedom of design around the displacement module 82 is improved.

(12) The inner ring 51 for holding the lens frame body 43 is provided at the inner side of the frame member 41. The outer ring 52, the inner ring 51, and the lever 54 and arms 53$a$1, 53$a$2, 53$b$1, 53$b$2, 53$c$, 53$c$2 for conveying the displacement of the displacement module 82 to the inner ring 51 are integrally formed with the frame member 41. Thus, the number of components is not increased, the optical element holding device 38 is not enlarged, and advantages (1) to (10) are obtained. Particularly, since the outer ring 52, the inner ring 51, the lever 54 and the arms 53$a$1, 53$a$2, 53$b$1, 53$b$2, 53$c$, 53$c$2 are formed as a single structure, the displacement of the displacement module 82 is conveyed to the inner ring 51 without causing backlash or hysteresis. The orientation of the optical element 37 is thus accurately controlled.

(13) The upper surface of the inner ring 51 is substantially arranged in the same plane as the first surface of the outer ring 52. Thus, enlargement of the optical element 37 in the optical axis direction is suppressed when the barrel modules 39$a$ of the optical element holding device 38 are stacked to form the barrel 39, and enlargement of the exposure apparatus 31 is suppressed.

(14) The optical element holding device 38 includes the biasing spring 77 for biasing the lever 54 towards the outer ring 52 side and the jack up module 97 for adjusting the biasing force of the biasing spring 77. Thus, in a state in which the driving force F conveyed by the displacement of the displacement module 82 is released, the lever 54 is displaced towards the outer ring 52 side by the biasing force of the biasing spring 77. By adjusting the biasing force of the biasing spring 77 with the jack up module 97, the lever 54 is maintained at a predetermined position in a state in which the driving force F from the displacement module 82 is released. The lever 54 is thus maintained at a predetermined position in a state in which the driving force from the displacement module 82 is released.

When applying the driving force F again to the lever 54 from the displacement module 82 without using the jack up module 97, there is concern for the following. The biasing force of the biasing spring 77 acts between the adjustment washer 85, the adjustment button 86, the displacement rod 84, and the spherical boss 92 of the lever 54 side even in a state in which the driving force F from the displacement module 82 is released (state in which the adjustment base plate 87 is removed in the present embodiment). The lever 54 is in a state contacting the outer ring 52 side due to the biasing force of the biasing spring 77. In this state, the adjustment washer 85 and the adjustment button 86 are changed from the attached ones to different ones. When the adjustment base plate 87 is attached to the frame member 41 against the biasing force of the biasing spring 77 so as to again apply the driving force F to the lever 54, the adjustment washer 85, the adjustment button 86, the displacement rod 84, and the spherical boss 92 are moved in a state pressing one another. Thus, microscopic deformation may occur on the contacting surface of the adjustment washer 85, the adjustment button 86, the displacement rod 84, and the spherical boss 92.

By using the optical element holding device 38, the recovery task of the driving force F with respect to the lever 54 is performed through the following procedures. That is, in a state in which the lever 54 is held at a predetermined position with the jack up module 97, the adjustment washer 85 and the adjustment button 86 are exchanged and the adjustment base plate 87 is attached. The holding of the lever 54 with the jack up module 97 is released so that the spherical boss 92 on the lever 54 side contacts the displacement rod 84 of the displacement module 82 due to the biasing force of the biasing spring 77. The contacting surfaces of the adjustment washer 85, the adjustment button 86, the displacement rod 84, and the spherical boss 92 on the lever 54 side in the displacement module 82 are prevented from being affected by the adjustment of the driving force F of the lever 54. Thus, the driving displacement ΔL applied to the lever 54 is thus accurately set and the controlling accuracy of the orientation of the optical element 37 is improved.

The series of adjustment tasks of the driving force F is performed in a state in which the biasing force of the biasing spring 77 is released. Thus, removal of the adjustment base plate 87 is facilitated and the adjustment task of the driving force F in the displacement module 82 is easily performed.

(15) The arms 53a1, 53a2, 53b1, 53b2, 53c, 53c2 are formed inclined with respect to the optical axis AX of the optical element 37. Thus, with a simple structure, the optical element 37 is displaced not only within the plane orthogonal to the optical axis AX of the optical element but also to the plane intersecting the optical axis at a predetermined angle. Therefore, the optical element 37 may be adjusted to any orientation, and the degree of freedom of displacement of the optical element 37 is increased.

(16) The large recess 62b having an open area larger than the small recess 61a on the first surface 60 side is formed on the second surface 63 side of the frame member 41 with its center aligned with the element side pivot 58. The large recess 62a opens on the first surface 60 side and the small recess 61b opens on the second surface 63 side in the frame member 41 so that their centers are aligned with the frame side pivot 59. Since the portion corresponding to the bottom surface of the large recesses 62a, 62b in the element side pivot 58 and the frame side pivot 59 are formed without steps, the excessive lowering of the rigidity at the vicinity of each pivot 58, 59 is suppressed.

(17) The lever 54 also functions to restrict the displacement direction of the frame side pivot 59 connected to the arms 53a1, 53a2, 53b1, 53b2, 53c1, 53c2. Therefore, the frame side pivot 59 is constantly displaced in a predetermined direction and the arms 53a1, 53a2, 53b1, 53b2, 53c1, 53c2 are stably displaced.

(18) Each lever 54 is elongated, rotatably attached with to the outer ring 52 by the supporting point pivot 66 at one corner of the first end portion, and rotatably connected to the first end portion of the arm 53a1, 53a2, 53b1, 53b2, 53c1, 53c2 by the frame side pivot 59 in the vicinity of the other corner. The second end portion of the lever 54 is formed to be rotatable about the supporting point pivot 66 serving as an attachment portion with the outer ring 52. Therefore, the driving forces F applied from the displacement module 82 and conveyed to the arms 53a1, 53a2, 53b1, 53b2, 53c1, 53c2 are reduced in accordance with the ratio of the distance α between the force point PF, to which the driving force F is applied at the second end portion, and the supporting point pivot 66 and the distance β between the supporting point pivot 66 and the frame side pivot 59. The lever 54 has a simple structure.

(19) The optical element holding device 38 includes the arms 53a1, 53a2, 53b1, 53b2, 53c1, 53c2 and the lever 54. The axis line of each arm 53a1, 53a2, 53b1, 53b2, 53c1, 53c2 is arranged substantially orthogonal to the inclined side 112 between the supporting point pivot 66 at the lever 54 and the frame side pivot 59. Each arm 53a1, 53a2, 53b1, 53b2, 53c1, 53c2 is displaced in the tangential plane Pt of a circle, the center of which is the optical axis AX of the optical element 37, by the rotation of the lever 54. Therefore, the driving displacement ΔL applied in the radial direction of the optical element 37 is converted to displacement in the tangential line direction of the optical element 37 by a simple structure at the second end portion of the lever 54.

(20) The second end portion on the opposite side of the first end portion connected to the outer ring 52 by the supporting point pivot 66 in the lever 54 is supported by the outer ring 52 with the L-shaped supporting link 55, which has a predetermined thickness in the optical axis direction of the optical element 37. Thus, the lever 54 is supported at both of its ends by the outer ring 52, and the supporting rigidity of the lever 54 in the optical axis direction of the optical element 37 is improved. This further stabilizes the rotating operation of the lever 54.

(21) The supporting link 55 includes the first supporting link 69, which is arranged along the extension of the straight line connecting the supporting point pivot 66 at the lever 54 and the distal end side supporting pivot 73, and the second supporting link 70, which is arranged to be orthogonal to the first supporting link 69. When the lever 54 is rotated, the first supporting link 69 is mainly displaced between the distal end side supporting pivot 73 and the intermediate supporting pivot 74 at the supporting link 55 side. The second supporting link 70 connected to the outer ring 52 absorbs cosine error resulting from displacement of the first supporting link 69. The cosine error is small enough so that it can be absorbed by slightly displacing the second supporting link 70. The displacement amount resulting from the displacement of the lever 54 at the second supporting link 70 may be set to be small, and the relative displacement amount of the second supporting link 70 with respect to the immovable outer ring 52 in a fixed state may be decreased. Therefore, the distortion amount produced by the rotation of the lever 54 at the basal end side supporting pivot 75 between the outer ring 52 and the second supporting link 70 is reduced.

(22) The basal end side supporting pivot 75 between the second supporting link 70 and the outer ring 52 is thicker than the distal end side supporting pivot 73 and the intermediate supporting pivot 74 at the two ends of the first supporting link 69 in the supporting link 55. Thus, the lever 54 is supported at the outer ring 52 with higher rigidity. In particular, with the structure described in (21), the displacement of the first supporting link 69 and the lever 54 is not affected even if the thickness of the basal end side supporting pivot 75 is increased since the displacement amount of the second supporting link 70 is small. Actually, the rotating operation of the lever 54 is further stabilized.

(23) The adjustment base plate 87, the adjustment washer 85, and the adjustment button 86 in the displacement module 82 are removably attached to the frame member 41. Thus, when changing the driving force F with the displacement module 82, jobs are carried out with part of the displacement module 82 removed from the frame member 41. This improves the workability.

(24) The optical element 37 of the barrel 39 is held by the optical element holding device 38 having the superior advantages described in (1) to (23). Thus, the orientation of the optical element 37 held in the barrel 39 is finely controlled, and the imaging performance of the projection optical system 35 including the optical element 37 is improved. This transfers and exposes the image of the pattern on the reticle Rt onto the wafer W with higher accuracy, and the exposure precision of the exposure apparatus 31 is improved.

Modifications

The embodiment of the present invention may be modified as follows.

In the preferred embodiment, each arm 53a1, 53a2, 53b1, 53b2, 53c1, 53c2 is arranged on the tangential plane Pt of a circle of which the center is the optical axis AX of the optical element 37, and the driving line L1 of the frame side pivot 59 is set on the tangential plane Pt. However, each arm 53a1, 53a2, 53b1, 53b2, 53c1, 53c2 may be arranged at a position separated from the tangential plane Pt.

In particular, when holding an optical element having a diameter that is smaller than the outer diameter of the frame member 41, the first surface 60 and the second surface 63 side in the tangential plane Pt may be brought closer to the optical axis AX of the optical element 37 and arranged on an inclined plane. In such a structure, when holding the optical element 37 of small diameter, the optical element 37 is held with a small lens frame body 43 without using a large lens frame body 43. Consequently, increase in weight around the driven optical element 37 is avoided, and orientation adjustment of the optical element 37 is facilitated.

The driving line L1 of the frame side pivot 59 may be separated from the tangential plane Pt. The arms 53a1, 53a2, 53b1, 53b2, 53c1, 53c2 do not have to be in pairs and at least one in each pair may be arranged independently from the other arm.

In the preferred embodiment, two arms 53a1 and 53a2 (53b1 and 53b2, 53c1 and 53c) of each link mechanism 53a, 53b, 53c are symmetric with respect to the radial plane Pr. However, the two arms 53a1 and 53a2 (53b1 and 53b2, 53c1 and 53c) may be asymmetric with respect to the radial plane Pr.

The link mechanisms 53a, 53b, 53c do not have to be arranged at equiangular intervals along a circle of which the center is the optical axis AX of the optical element 37. It is only required that the optical element holding device 38 have a mechanism capable of adjusting the orientation of the holding optical element 37 with six degrees of freedom. More specifically, it is only required that the optical element holding device includes six arms rotatably connected to the frame member 41 on the fixed portion side and the support member 42 for supporting the optical element 37, and that the six arms be arranged so that the extensions of each arm do not intersect at one point.

In the preferred embodiment, there are two lines, a line connecting the element side pivot 58 and the frame side pivot 59 of the two ends of each arm 53a1, 53a2, 53b1, 53b2, 53c1, 53c2 and a line connecting the frame side pivot 59 and the supporting point pivot 66 of one end of the lever 54. The element side pivot 58, the frame side pivot 59, and the supporting point pivot 66 are arranged so that the two lines are orthogonal to each other. However, each pivot 58, 59, 66 may be arranged so that the two lines are not orthogonal to each other. When arranged so that the two lines are not orthogonal, as the angle formed by the two lines deviate more from a right angle, the driving force F applied to the force point PF of the lever 54 is reduced and conveyed to each arm 53a1, 53a2, 53b1, 53b2, 53c1, 53c2.

In the preferred embodiment, the adjustment of the driving force F at the displacement module 82 is performed by selecting and exchanging appropriately ones of the plurality of adjustment washers 85 and adjustment buttons 86 and displacing the displacement rod 84. However, for example, a micrometer may be used in the displacement module 82, and the displacement rod 84 may be displaced by moving the micrometer forward or backward. In such a case, the adjustment of the driving force F is facilitated and fine adjustment is also facilitated.

Figure 14:
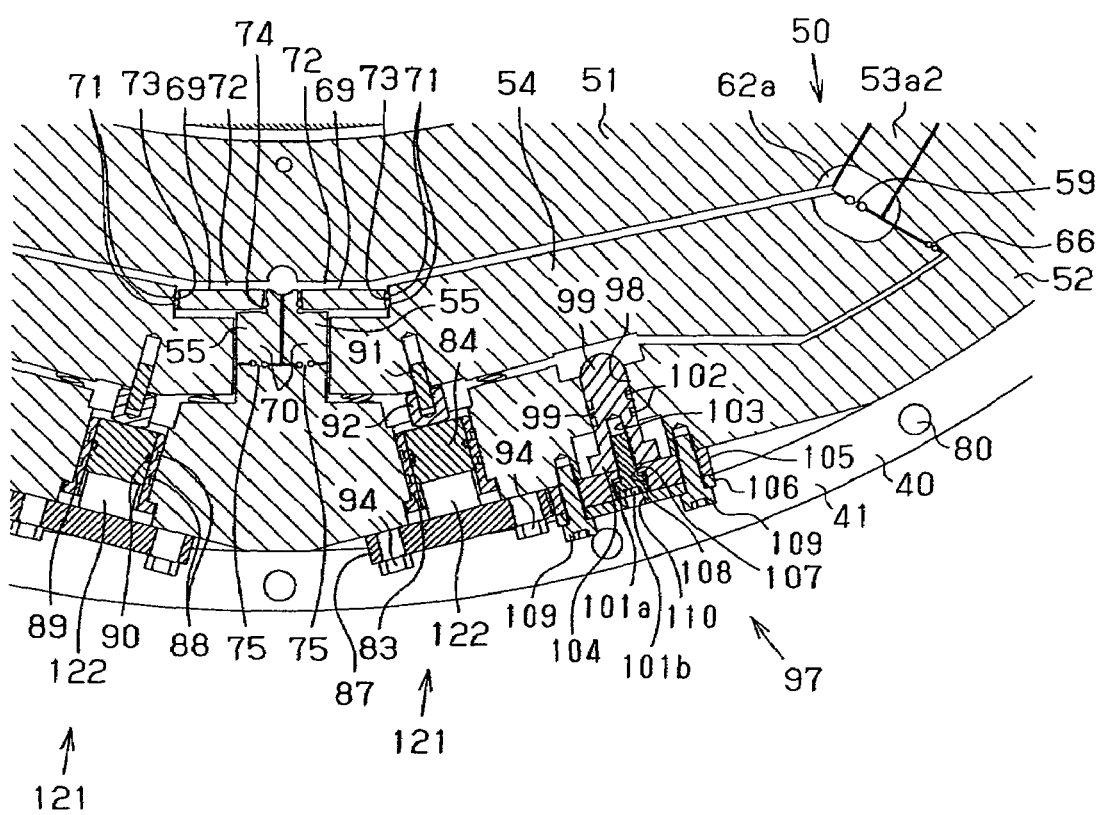
FIG. 14 is a cross-sectional view showing a modification of a displacement module.

As shown in FIG. 14, an actuator such as a piezoelectric element 122 may be installed in the displacement module 121, and the displacement rod 84 may be displaced by the drive of the piezoelectric element 122. When the piezoelectric element 122, which is remotely operable is used, the orientation control of the optical element 37 may be carried out at a remote location. For example, if the orientation of the optical element 37 is controlled in accordance with the control signal generated based on the aberration information, the irradiation history of the optical element 37, change in the environment condition which the exposure apparatus 31 is arranged, change in the exposure condition such as the illuminating condition and the like obtained during the operation of the exposure apparatus 31, correction of aberration is carried out more finely and in real time. The exposure accuracy in the exposure apparatus 31 is improved, and throughput is improved by reduction of down time. Further, a fluid pressure actuator may be used instead of the piezoelectric element 122.

A sensor for detecting the orientation of the optical element 37 may be used. In such a case, further accurate orientation control of the optical element 37 is performed. In particular, when a hermetic seal of the barrel 39 must be ensured, an optical window is arranged on the outer circumferential surface of the frame member 41, and a sensor of an optical encoder type or an electrostatic capacity type for reading a scale attached to the optical element 37 or the lens frame body 43 through the optical window with a head arranged outside the barrel 39 is preferable. In such a case, cords connected to the sensor and substrate of the sensor and the like do not need to be arranged inside the barrel 39. This keeps the inside of the barrel 39 clean.

If the joining surface of the fastening portion 40 is machined and finished with high precision, the O-ring may be omitted, and the fastening portions 40 of the two frame members 41 may be directly fastened to each other.

A gasket may be arranged between the joining surfaces of the fastening portions 40, and the joining portion of the fastening portion 40 may be covered with a cover. An O-ring may be arranged between the cover and the outer circumferential surface of the fastening portion 40.

If flexible O-rings having hollow structures are held between stacked barrel modules 39a, the alignment of the barrel modules 39a would be facilitated.

In the preferred embodiment, the lens frame body 43 may be omitted, and the first end portion of the arm 53a1, 53a2, 53b1, 53b2, 53c1, 53c2 may be directly connected to the support member 42 by the element side pivot 58.

The first supporting link 69 and the second supporting link 70 may intersect at an angle smaller than 90 degrees or at an angle greater than 90 degrees. Further, the supporting link 55 may be omitted. An L-shaped plate spring and the like may be arranged in place of the supporting link 55. In this case, the plate spring is formed through wire cut and electrical discharge machining into a structure that is the same as the frame member 41. Further, in the preferred embodiment, the first supporting link 69 is arranged so as to extend along an extension of the line connecting the supporting point pivot 66 and the distal end side supporting pivot 73 of the two ends of the lever 54. However, the first supporting link 69 may be separated from the extension of the line.

In the preferred embodiment, the O-rings 90, 88 are arranged between the outer circumferential surface of the displacement rod 84 in the displacement module 82 and the displacement rod housing 89, and between the outer circumferential surface of the displacement rod housing 89 and the inner circumferential surface of the displacement module attachment hole 83. A magnetic fluid seal and the like may be used in place of the O-rings 90, 88. This is particularly effective in a structure for controlling the orientation of the optical element 37 during the operation of the exposure apparatus 31 since the hysteresis factors are eliminated.

In the preferred embodiment, the displacement rod 84 is accommodated in the displacement module attachment hole 83 of the frame member 41 in a state accommodated in the displacement rod housing 89. However, the displacement rod housing 89 may be omitted and the displacement rod 84 may be attached directly to the displacement module attachment hole 83.

In the preferred embodiment, the driving force F is applied to the lever 54 by the movement (translational motion) in the radial direction of the optical element 37 of the displacement rod 84. However, the driving force may be applied to the lever 54 by rotating the displacement rod 84, moving the displacement rod 84 in the optical axis direction or other directions, or by rotating the displacement rod 84 in the circumferential direction of the frame member 41.

In the preferred embodiment, the element side pivot 58 is defined between the small recess 61a from the first surface 60 and the large recess 62b from the second surface. The frame side pivot 59 is defined between the small recess 61b from the second surface 63 and the large recess 62a from the first surface 60. However, at least one of either the element side pivot 58 or the frame side pivot 59 may be defined between the small recesses 61a, 61b and a different small recess may be formed at the bottom of the large recess 62a, 62b. In such a case, the large recess 62a, 62b are cut out and formed with a predetermined depth in the recess of the side in which the cut out amount of the first surface 60 or the second surface 63 of the frame member 41 is large. A different small recess 61a, 61b is then formed through electrical discharge machining from the bottom. This easily forms the small recesses 61a, 61b on both sides of each pivot 58, 59. Thus, even when forming small recesses 61a, 61b on both sides of each pivot 58, 59, the machining time may be reduced.

In such a structure, a pair of small recesses 61a, 61b on both sides of the neck in each pivot 58, 59 are formed during the same cutting process. This prevents unpredictable distortion at each pivot 58, 59 from remaining. This further improves the accuracy of the orientation control of the optical element 37 at the optical element holding device 38.

In the embodiment, the optical element 37 is given as an example of a lens. However, the optical element 37 may be another type of optical element, such as a parallel flat plate, a mirror, a half-mirror and the like.

The optical element holding device 38 of the present invention is not limited to the holding structure for the optical element 37 of the horizontal type as in the projection optical system 35 of the exposure apparatus 31 in the preferred embodiment, and may be embodied in a holding structure for an optical element in the illumination optical system 33 of the exposure apparatus 31 or a holding structure for the optical element 37 of the vertical type. Further, the present invention may be embodied in a structure for holding the optical element in an optical system of other optical machines such as a microscope, an interferometer and the like.

An optical system of a contact exposure apparatus, in which the mask and the substrate are closely contacted and the pattern of the mask is exposed, and a proximity exposure apparatus, in which the mask and the substrate are located near each other and the pattern of the mask is exposed, may be applied as the exposure apparatus without using a projection optical system. Further, the projection optical system it is not limited to a total refraction type and may be of a catadioptric type.

The exposure apparatus of the present invention is not limited to the exposure apparatus of a reduction exposure type, and may be, for example, an exposure apparatus of the equal exposure type or the enlargement exposure type.

In order to manufacture reticles or masks used not only in micro-devices such as semiconductors, but also in a light exposure apparatus, EUV exposure apparatus, X-ray exposure apparatus, and electron ray exposure apparatus and the like, the present invention may also be applied to an exposure apparatus for transferring a circuit pattern from a mother reticle to a glass substrate or a silicon wafer. Generally, transmissive reticle is used in the exposure apparatus using DUV (deep ultraviolet) or VUV (vacuum ultraviolet) light and the like, and quartz glass, quartz glass doped with fluorine, fluorite, magnesium fluoride or crystal and the like is used as the reticle substrate. In the proximity type X-ray exposure apparatus or electron ray exposure apparatus and the like, the transmissive mask (stencil mask, membrane mask) is used, and silicon wafer or the like is used as the mask substrate. The present invention is not only applicable to the exposure apparatus used in manufacturing the semiconductor device, but also to an exposure apparatus used in manufacturing displays including liquid crystal display (LCD) and the like to transfer a device pattern onto the glass plate. The present invention is also applicable to an exposure apparatus used in manufacturing thin-film magnetic heads or the like and transferring the device pattern onto ceramic wafers or the like, and an exposure apparatus used in manufacturing imaging devices such as CCDs.

Further, the present invention is applicable to a scanning stepper for transferring the pattern of a mask to a substrate in a state in which the mask and the substrate are relatively movable and sequentially step-moving the substrate. The present invention is also applicable to a step-and-repeat type stepper for transferring the pattern of a mask in a state in which the mask and the substrate are stationary and sequentially step-moving the substrate.

In addition to the ArF excimer laser (193 nm), $F_2$ laser (157 nm) described in the preferred embodiment, g-line (436 nm), i-line (365 nm), KrF excimer laser (248 nm), $Kr_2$ laser (146 nm), $Ar_2$ laser (126 nm) may be used as the light source of the exposure apparatus. Further, the harmonic component wave in which the single wavelength laser light of infrared region or visible region oscillated from a DFB semiconductor laser or a fiber laser may be amplified with fiber amplifier doped with, for example, erbium (or both erbium and ytterbium), and wave-converted to ultraviolet light using a non-linear optical crystal may be used.

The exposure apparatus 31 of the embodiment is manufactured in the following way. At least some of the optical element 37 of a plurality of lenses or mirrors etc. forming the illumination optical system 33 and the projection optical system 35 is held by the optical element holding device 38 of the preferred embodiment or a modification, the illumination optical system 33 and the projection optical system 35 are incorporated in the main body of the exposure apparatus 31, and then optical adjustment is performed. Subsequently, the wafer stage 36 (also reticle stage 34 in case of scan type exposure apparatus) including many mechanical components is attached to the main body of the exposure apparatus 31 and wires are connected. A gas supply pipe for supplying gas is then connected to the optical path of the exposure light and total adjustment (electronic adjustment, checking of operations etc.) is performed.

Each component configuring the optical element holding device 38 is assembled after eliminating impurities such as machining oil or metal substances through ultrasonic cleaning. The manufacturing of the exposure apparatus 31 is desirably performed in a clean room in which temperature, moisture, and air pressure are controlled and cleanliness is adjusted.

Fluorite and quartz are given as examples of the glass material in the preferred embodiment. However, the optical element holding device 38 of the embodiment may be applied even when using improved quartz such as crystal of lithium fluoride, magnesium fluoride, strontium fluoride, lithium-calcium-aluminum-fluoride, lithium-strontium-aluminum-fluoride and the like, or glass fluoride including zirconium-barium-lanthanum-aluminum, quartz glass doped with fluoride, quartz glass doped with hydrogen in addition to fluoride, quartz glass containing OH-base, and quartz glass containing OH-base in addition to fluoride.

Figure 15:
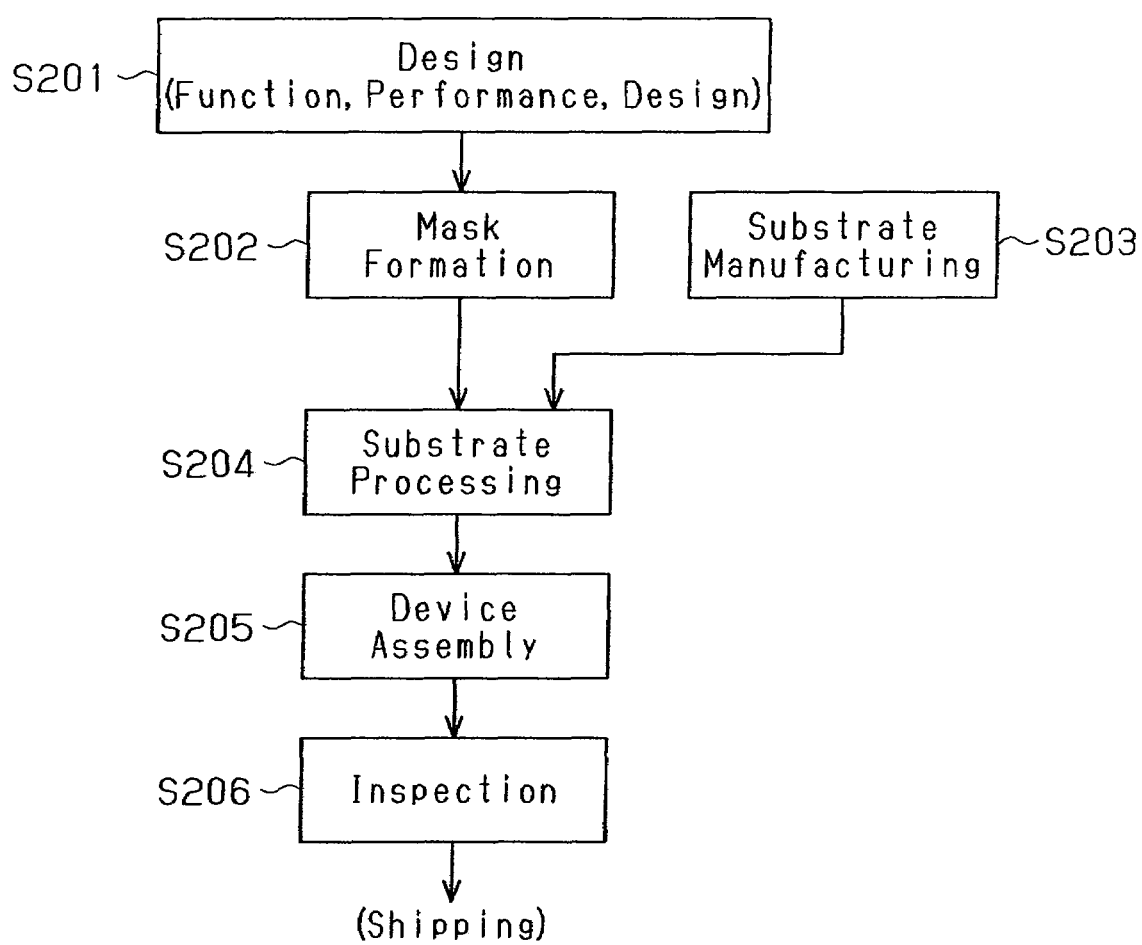
FIG. 15 is a flowchart showing the manufacturing procedures of a device.

An embodiment of a method for manufacturing a device during which the above described exposure apparatus 31 is used in the lithography step will now be described. FIG. 15 is a flowchart showing a manufacturing example for a device (semiconductor device such as an IC or LSI, liquid crystal display device, imaging device, CCD etc.), a thin-film magnetic head, a micro-machine etc. As shown in FIG. 15, first, the function and performance design (e.g., circuit design of semiconductor device) of the device (micro-device) is performed in step S201 (design step), and pattern design for realizing the function is performed. Subsequently, in step S202 (mask formation step), a mask (reticle Rt etc.) on which the designed circuit pattern is formed is fabricated. In step S203 (substrate manufacturing step), the substrate (wafer W when silicon material is used) is manufactured using materials such as silicon, glass plate etc.

In step S204 (substrate processing step), the actual circuit etc. is formed on the substrate by employing the lithography technique and the like using the mask and the substrate prepared in steps S201 to S203. In step S205 (device assembly step), device assembly is performed using the substrate processed in step S204. Step S205 includes steps such as a dicing step, a bonding step, and a packaging step (chip enclosure etc.) that are performed if necessary.

Finally, in step S206 (inspection step), inspections, such as an operation check test, a durability test and the like, are performed on the device formed in step S205. The device is then completed after the above steps and shipped out of the factory.

Figure 16:
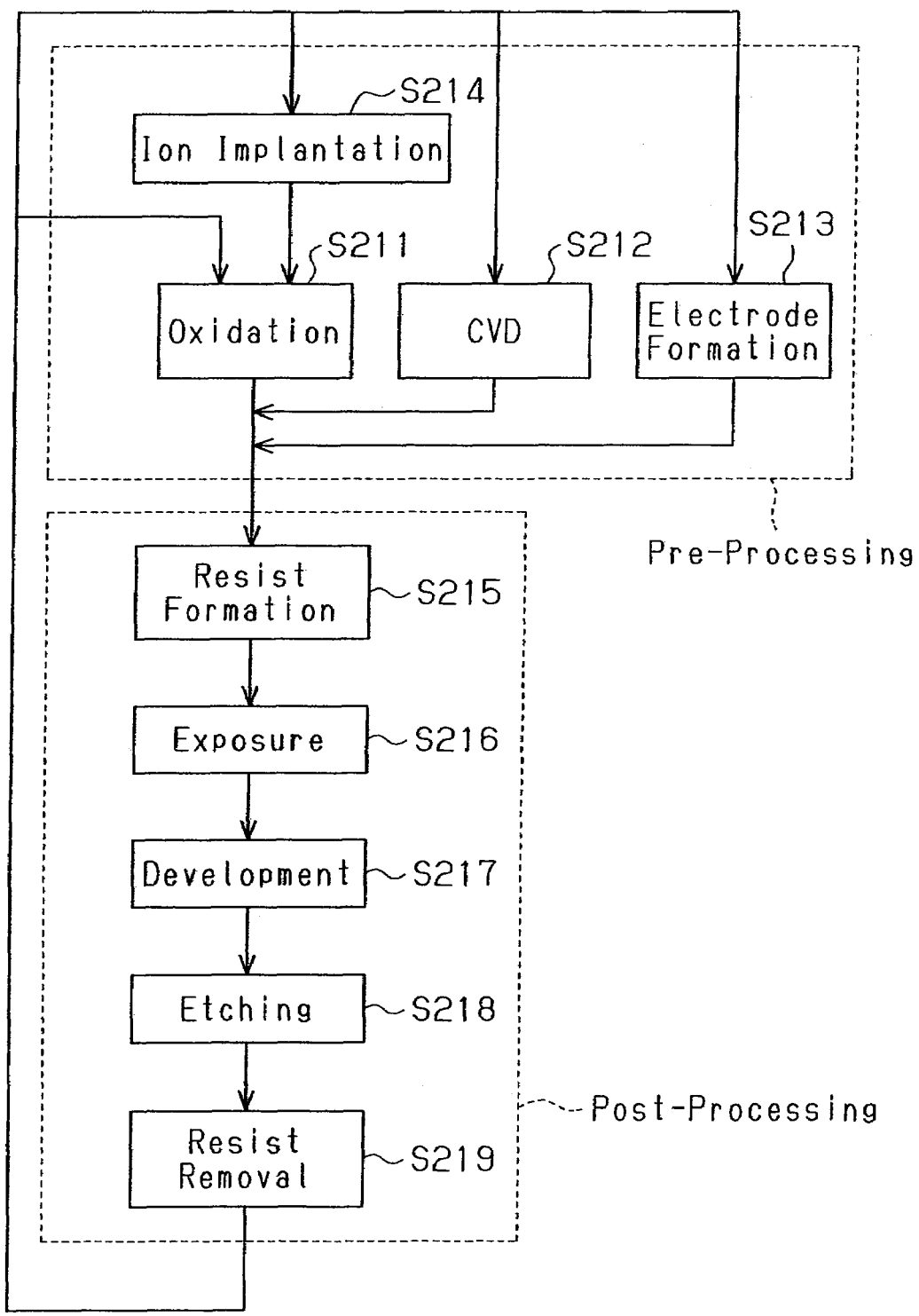
FIG. 16 is a flowchart showing a substrate processing step of FIG. 15 in detail.
Figure 17:
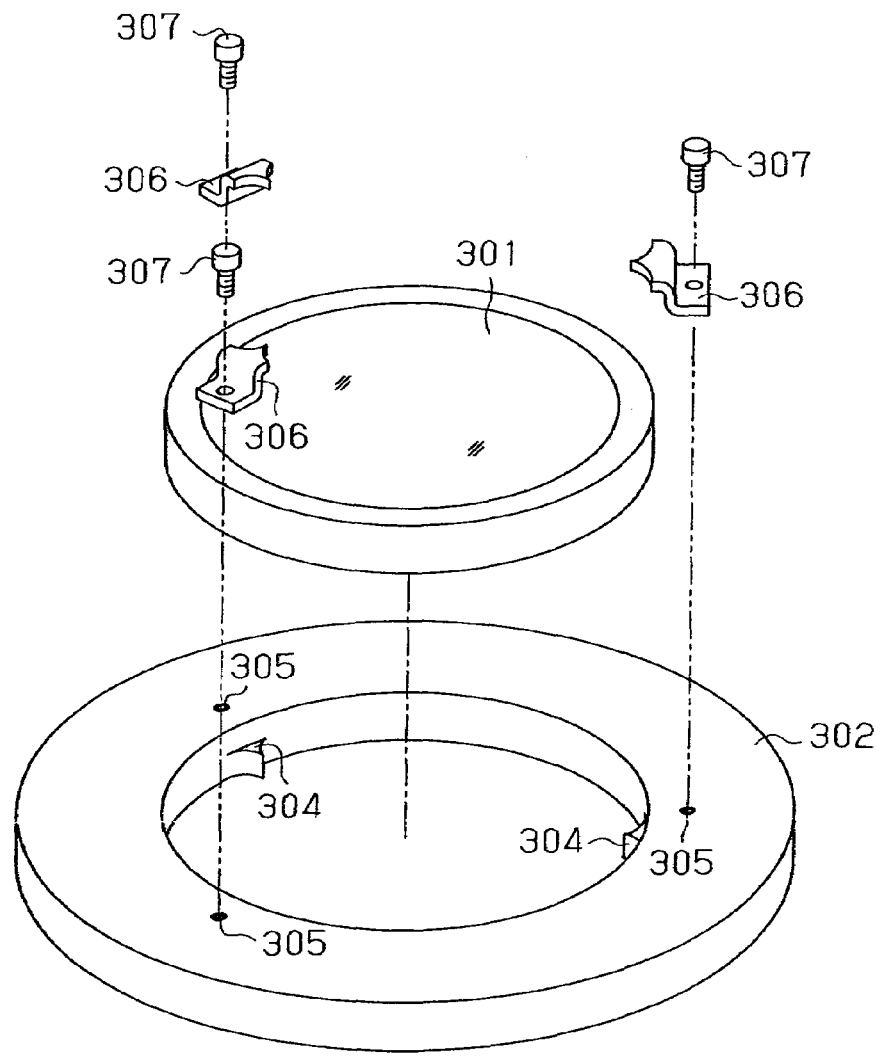
FIG. 17 is an exploded perspective view showing an optical element holding device of the prior art.
Figure 18:
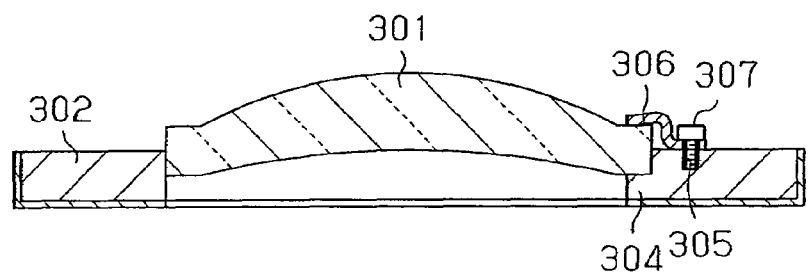
FIG. 18 is a cross-sectional view of the optical element holding device of FIG. 17.

FIG. 16 shows one example of a detailed flow of step S204 in FIG. 15. In FIG. 16, the surface of the wafer W is oxidized in step S211 (oxidization step) In step S212 (CVD step), the insulation film is formed on the surface of the wafer W. In step S213 (electrode formation step), the electrode is formed on the wafer W through deposition. In step S214 (ion implantation step), ions are implanted into the wafer W. Each of the above steps S211-S214 define a pre-processing step for each stage of the wafer process and are selected and executed in accordance with the necessary process in each stage.

In each stage of the wafer process, after the above pre-processing steps are completed, the following post-processing steps are performed. In the post-processing steps, first, a photosensitive agent is applied to the wafer W in step S215 (resist formation step). In step S216 (exposing step), the circuit pattern of the mask (reticle Rt) is transferred to the wafer W through the lithography system (exposure apparatus 31) described above. In step S217 (developing step), the exposed wafer W is developed, and in step S218 (etching step), the exposed members of portions other than portions where the resist remains is removed through etching. In step S219 (resist removal step), the resist that is unnecessary after etching is removed.

The pre-processing steps and the post-processing steps are repeatedly performed to form multiple circuit patterns on the wafer W.

The method for manufacturing the device of the present embodiment that is described above enables the above described exposure apparatus 31 to be used in the exposure step (step S216) and improve resolution with the exposure light EL of vacuum ultraviolet region. Further, exposure amount control is performed with high accuracy. Consequently, devices having high integration with a minimum line width of about 0.1 μm are produced at a satisfactory yield.

The present examples and embodiments are to be considered as illustrative and not restrictive, and the invention is not to be limited to the details given herein, but may be modified within the scope and equivalence of the appended claims.

What is claimed is:

1. An optical element holding device comprising:
   a frame member;
   a holding member which is provided at an inner side of the frame member and holds an optical element;
   an adjustment mechanism which includes a plurality of levers each having a first end portion rotatable to the frame member and a second end portion engaged with a displacement member which displacement member is attached in an opening formed in a side surface of the frame member, and which includes six arms each having a first end portion rotatably connected to the holding member and a second end portion rotatably connected to the lever, and adjusts orientation of the optical element, held by the holding member, with six degrees of freedom; and
   a seal member arranged between an inside surface of the opening and an outside surface of the displacement member.

2. The optical element holding device according to claim 1, wherein the adjustment mechanism adjusts the orientation of the optical element in a direction parallel to an optical axis of the optical element and in a direction intersecting the optical axis.

3. The optical element holding device according to claim 1, wherein the six arms form first, second, and third link mechanisms, each including two of said arms, the first, the second, and the third link mechanisms being arranged at equiangular intervals about the optical axis.

4. The optical element holding device according to claim 3, wherein the two first link portions forming each link mechanism are arranged along a first plane, which is substantially parallel to the optical axis and includes a tangential line of a circle of which the center is the optical axis, and symmetric to each other with respect to a second plane, which includes the optical axis and which is orthogonal to the first plane.

5. The optical element holding device according to claim 1, wherein the frame member, the holding member, and part of the adjustment mechanism are integrally formed as a single structure, the single structure includes:
   a first surface substantially orthogonal to the optical axis; and
   a second surface substantially parallel to the first surface, at least one of the arms including a first neck portion, defined by a first recess formed in the first surface, and a second neck portion, defined by a second recess formed in the second surface, the at least one of the arms being connected to the holding member at the first neck portion.

6. The optical element holding device according to claim 5, wherein the lever includes a pivot defined by a pair of through holes extending in a thicknesswise direction of the lever and a pair of slits extending from each through hole, the pivot rotatably connecting the lever to the frame member.

7. The optical element holding device according to claim 1, wherein the displacement member includes a contact portion which contacts the lever and a changing member which changes a displacement amount of the lever.

8. The optical element holding device according to claim 7, wherein the changing member is an actuator for changing the displacement amount of the lever in accordance with a control signal.

9. The optical element holding device according to claim 5, wherein:
the first neck portion is formed at a position corresponding to the second neck portion in the first surface and has an open area greater than that of the second recess; and
the second neck portion is formed at a position corresponding to the first neck portion in the second surface and has an open area greater than that of the first recess.

10. The optical element holding device according to claim 6, wherein the lever restricts a displacement direction of the first end portion of the arm.

11. The optical element holding device according to claim 6, further comprising:
an L-shaped link portion which is provided at a position differing from that of the pivot and connects the lever and the frame member.

12. The optical element holding device according to claim 11, wherein the third link portion includes:
a first supporting link arranged along an extension of a line connecting the pivot to a connecting portion of the lever and the third link portion; and
a second supporting link arranged orthogonal to the first supporting link.

13. The optical element holding device according to claim 7, wherein the displacement member is removable from the frame member.

14. The optical element holding device according to claim 1, wherein the displacement member displaces in a first displacement direction by a first displacement amount, and
the lever displaces in a second displacement direction, which intersects the first displacement direction, by a second displacement amount, which is different from the first displacement amount, when the displacement member displaces.

15. The optical element holding device according to claim 14, wherein the displacement member displaces the second end portion of the lever in a radial direction of the optical element, and a connecting portion of the lever and the arm moves along a plane substantially parallel to the optical axis of the optical element and includes a plane including a tangential line of a circle of which the center is the optical axis.

16. The optical element holding device according to claim 14, wherein a surface of the frame member substantially orthogonal to an optical axis of the optical element and a surface of the inner frame member substantially orthogonal to the optical axis are substantially arranged along the same plane.

17. The optical element holding device according to claim 5, further comprising:
a biasing member which is connected to the frame member and biases the lever towards the frame member; and
an adjusting member which is connected to the biasing member and adjusts a biasing force of the biasing member.

18. The optical element holding device according to claim 1, further comprising:
a first pivot which rotatably connects the arm and the holding member;
a second pivot which rotatably connects the arm and the lever; and
a third pivot which rotatably connects the lever and the frame member.

19. A barrel comprising:
at least one optical element; and
an optical element holding device according to claim 1 for holding the at least one optical element.

20. The barrel according to claim 19, wherein the optical element is one of a plurality of optical elements in a projection optical system for projecting an image of a predetermined pattern formed on a mask onto a substrate.

21. An exposure apparatus for exposing an image of a predetermined pattern onto a substrate, the exposure apparatus comprising:
a projection optical system which transfers the image of the predetermined pattern onto the substrate, wherein the projection optical system includes at least one optical element and an optical element holding device according to claim 1, 22. A method for manufacturing a device, the method comprising:
a lithography step including exposure performed with the exposure apparatus according to claim 21.

23. The optical element holding device according to claim 1, wherein the optical element is held by the holding member via a support member that supports a peripheral portion of the optical element.

24. The optical element holding device according to claim 23, wherein the support member includes a flexure structure.

25. The optical element holding device according to claim 14, wherein the displacement member displaces in a radial direction of the optical element as the first displacement direction.

26. The optical element holding device according to claim 17, wherein:
the biasing member extends between the lever and the frame member and biases the lever towards the frame member;
the adjusting member is attached to a position on the side surface of the frame member, other than the attachment portion to which the displacement member is attached, and adjusts the biasing force of the biasing member to restrict contact between the lever and the frame member.

27. The optical element holding device according to claim 1, wherein the frame member, the holding member, and part of the adjustment mechanism are integrally formed as a single structure.

28. The optical element holding device according to claim 1, wherein the holding member is an inner frame member provided at the inner side of the frame member, and the frame member, the inner frame member, and part of the adjustment mechanism are integrally formed as a single structure.

29. The optical element holding device according to claim 1, wherein the arm is inclined with respect to the optical axis of the optical element.

* * * * *